(12) United States Patent
Lin et al.

(10) Patent No.: US 12,400,910 B2
(45) Date of Patent: Aug. 26, 2025

(54) METHOD FOR FORMING SEMICONDUCTOR DEVICE WITH MONOCLINIC CRYSTALLINE METAL OXIDE CAPPING LAYER

(71) Applicant: TAIWAN SEMICONDUCTOR MANUFACTURING COMPANY, LTD., Hsinchu (TW)

(72) Inventors: Fan-Cheng Lin, Hsinchu (TW);
Po-Kai Hsiao, Changhua County (TW);
Tsai-Yu Huang, Taoyuan (TW);
Huicheng Chang, Tainan (TW);
Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 538 days.

(21) Appl. No.: 17/719,040

(22) Filed: Apr. 12, 2022

(65) Prior Publication Data

US 2023/0326788 A1    Oct. 12, 2023

(51) Int. Cl.

| | |
|---|---|
| *H01L 21/764* | (2006.01) |
| *H01L 21/02* | (2006.01) |
| *H01L 21/3105* | (2006.01) |
| *H10D 30/01* | (2025.01) |
| *H10D 30/67* | (2025.01) |
| *H10D 62/10* | (2025.01) |

(52) U.S. Cl.
CPC ...... *H01L 21/764* (2013.01); *H01L 21/02356* (2013.01); *H01L 21/31053* (2013.01); *H10D 30/031* (2025.01); *H10D 30/6735* (2025.01); *H10D 30/6757* (2025.01); *H10D 62/115* (2025.01); *H10D 62/118* (2025.01)

(58) Field of Classification Search
CPC ............ H01L 21/764; H01L 21/02356; H01L 21/31053; H01L 29/0649; H01L 29/0665; H01L 29/42392; H01L 29/66742; H01L 29/78696; H01L 29/0673
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| | (Continued) | |

*Primary Examiner* — Caleb E Henry
(74) *Attorney, Agent, or Firm* — Birch, Stewart, Kolasch & Birch, LLP

(57) ABSTRACT

A method includes forming a semiconductor fin protruding over a substrate; forming an isolation structure over the substrate; depositing a first metal oxide layer over the isolation structure; depositing a first oxide layer over the first metal oxide layer; depositing a second metal oxide layer over the first oxide layer, in which the first metal oxide layer and the second metal oxide layer comprise amorphous structures; performing a chemical mechanism polishing (CMP) process to the first metal oxide layer, the first oxide layer, and the second metal oxide layer; after the CMP process is completed, performing an annealing process such that the first metal oxide layer and the second metal oxide layer are transferred from the amorphous structures into crystalline structures; forming a gate structure over the semiconductor fin; and forming source/drain structures over the substrate and on opposite sides of the gate structure.

20 Claims, 42 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,716,158 B1* | 7/2017 | Cheng ............. H01L 21/823821 |
| 9,741,720 B1* | 8/2017 | Siddiqui ........... H01L 29/66545 |
| 10,008,578 B1* | 6/2018 | Lee ................... H01L 21/28088 |
| 10,192,985 B2* | 1/2019 | Wu ....................... H10D 64/259 |
| 10,497,577 B2* | 12/2019 | Wang ................. H10D 62/115 |
| 10,840,354 B2* | 11/2020 | Bi ....................... H10D 62/115 |
| 10,886,182 B2* | 1/2021 | Cheng ............. H01L 21/02255 |
| 10,943,819 B2* | 3/2021 | Chuang ............ H01L 21/76832 |
| 10,985,277 B2* | 4/2021 | Ching ............. H01L 21/823431 |
| 11,374,105 B2* | 6/2022 | Hsu ..................... H10D 62/115 |
| 11,488,855 B2* | 11/2022 | Lin ..................... H10D 30/6211 |
| 2015/0221884 A1* | 8/2015 | Han ..................... H10K 10/484 257/29 |
| 2016/0013308 A1* | 1/2016 | Lee ....................... H01L 29/785 257/401 |
| 2016/0049516 A1* | 2/2016 | Huang ............. H01L 29/66795 438/283 |
| 2016/0111518 A1* | 4/2016 | Chang ................ H01L 29/6656 257/401 |
| 2017/0213743 A1* | 7/2017 | Pan ................... H01L 21/02337 |
| 2018/0070868 A1* | 3/2018 | Lin ....................... G01J 3/2823 |
| 2018/0076282 A1* | 3/2018 | Chou ................ H10D 84/0151 |
| 2019/0157156 A1* | 5/2019 | Chen ................ H01L 21/76224 |
| 2019/0393078 A1* | 12/2019 | Singh ............... H01L 21/76283 |
| 2020/0006065 A1* | 1/2020 | Kao ................. H01L 21/02532 |
| 2020/0075758 A1* | 3/2020 | Chien ................. H10D 64/117 |
| 2020/0279943 A1* | 9/2020 | Niimi ............... H01L 21/76843 |
| 2021/0057522 A1* | 2/2021 | Lin ..................... H01L 27/0921 |
| 2021/0376071 A1* | 12/2021 | Liu ..................... H01L 23/5286 |
| 2021/0376072 A1* | 12/2021 | Yu ..................... H01L 29/42392 |
| 2022/0109066 A1* | 4/2022 | Niimi ............. H01L 21/823878 |
| 2022/0230908 A1* | 7/2022 | Hsiao ................. H10D 30/024 |
| 2022/0367685 A1* | 11/2022 | Wu ................... H01L 29/66439 |
| 2023/0025396 A1* | 1/2023 | Kao ................... H10D 30/0243 |

* cited by examiner

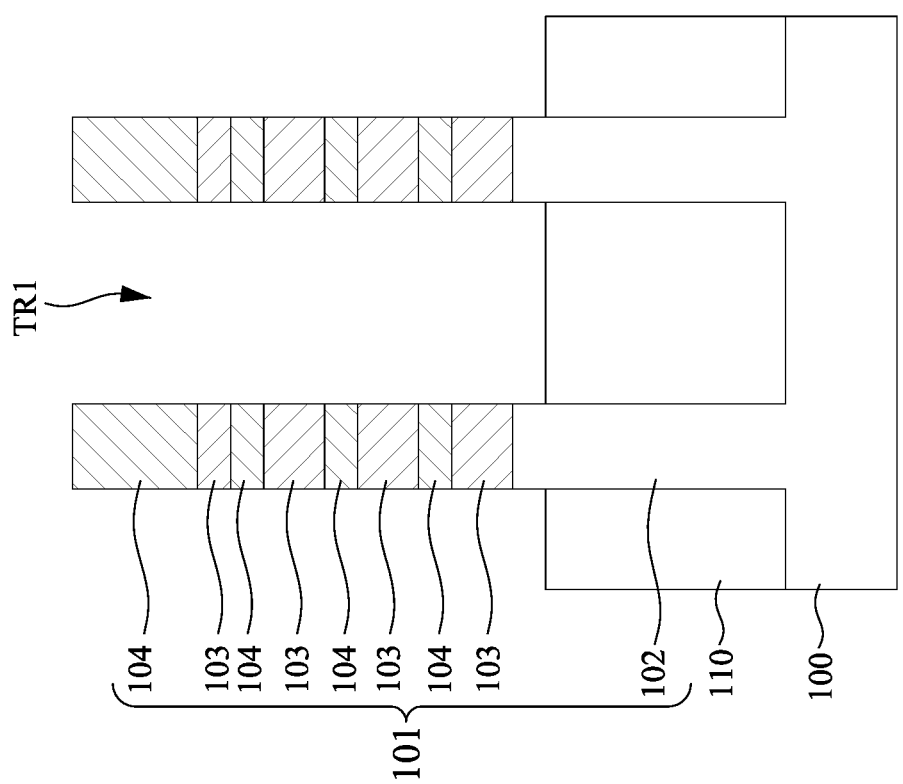

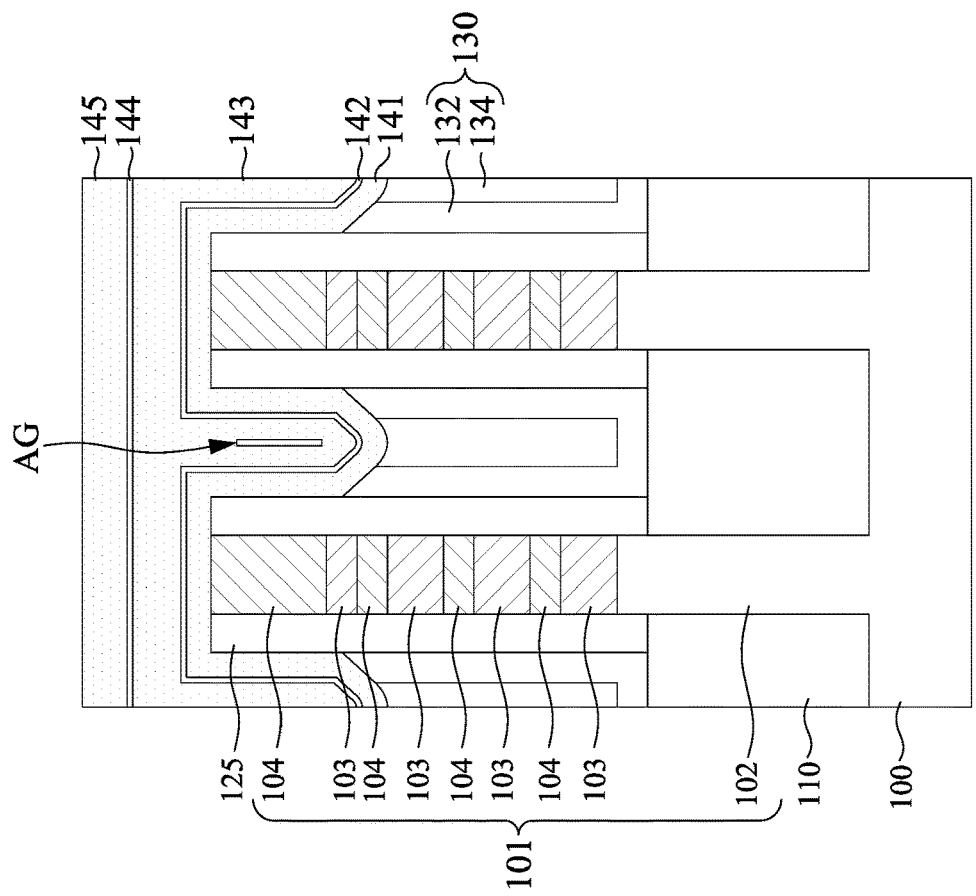
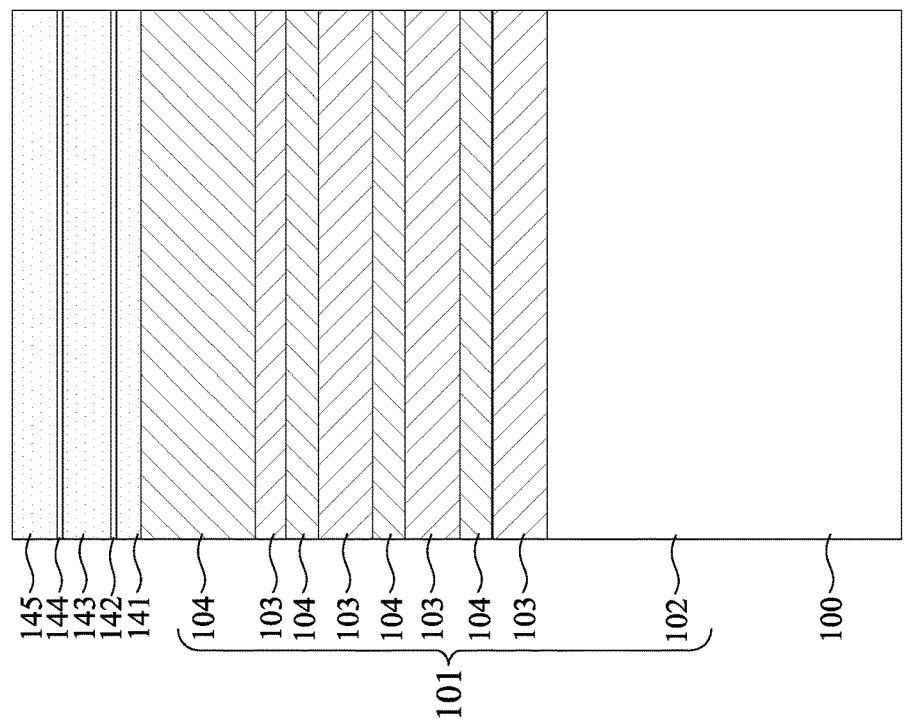
Fig. 10B
Fig. 10A

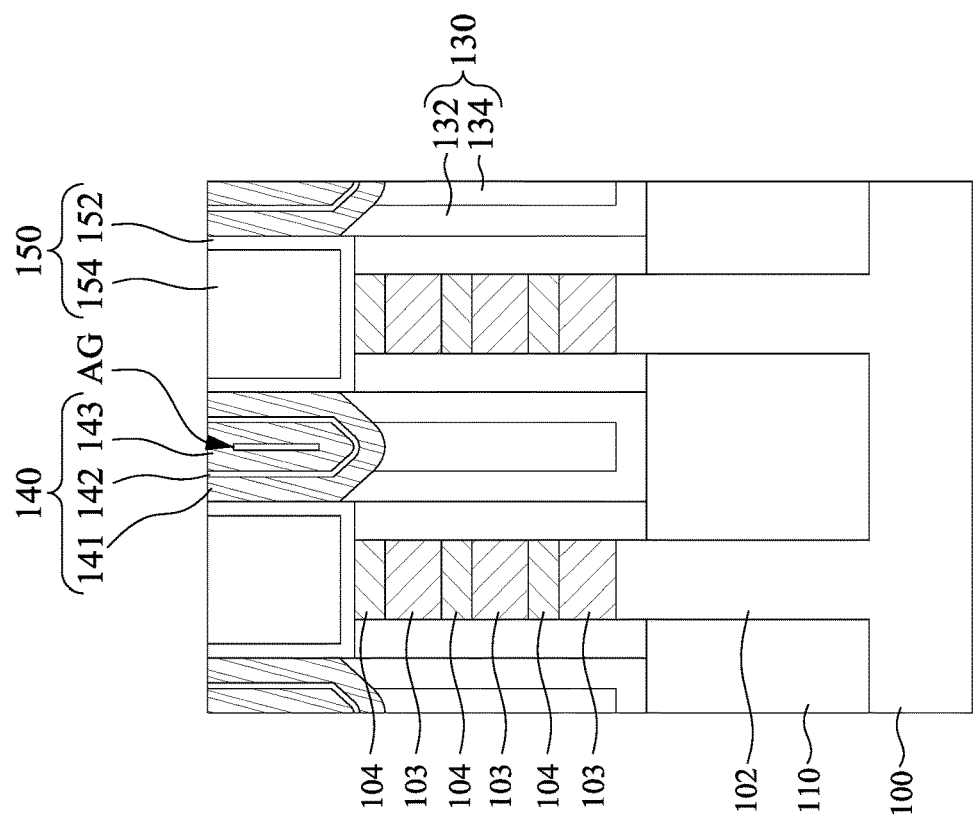
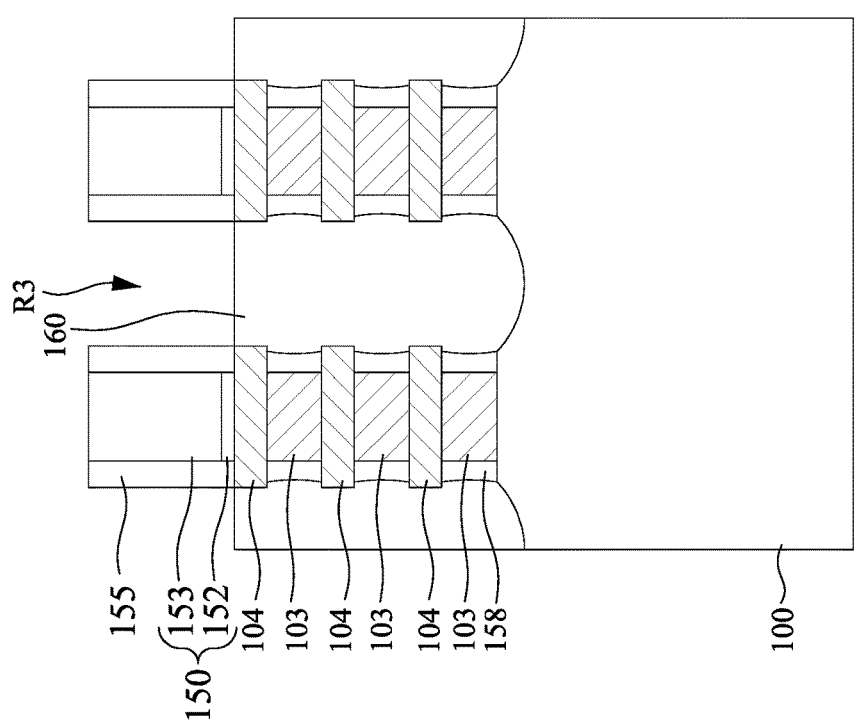
Fig. 16B
Fig. 16A

METHOD FOR FORMING SEMICONDUCTOR DEVICE WITH MONOCLINIC CRYSTALLINE METAL OXIDE CAPPING LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
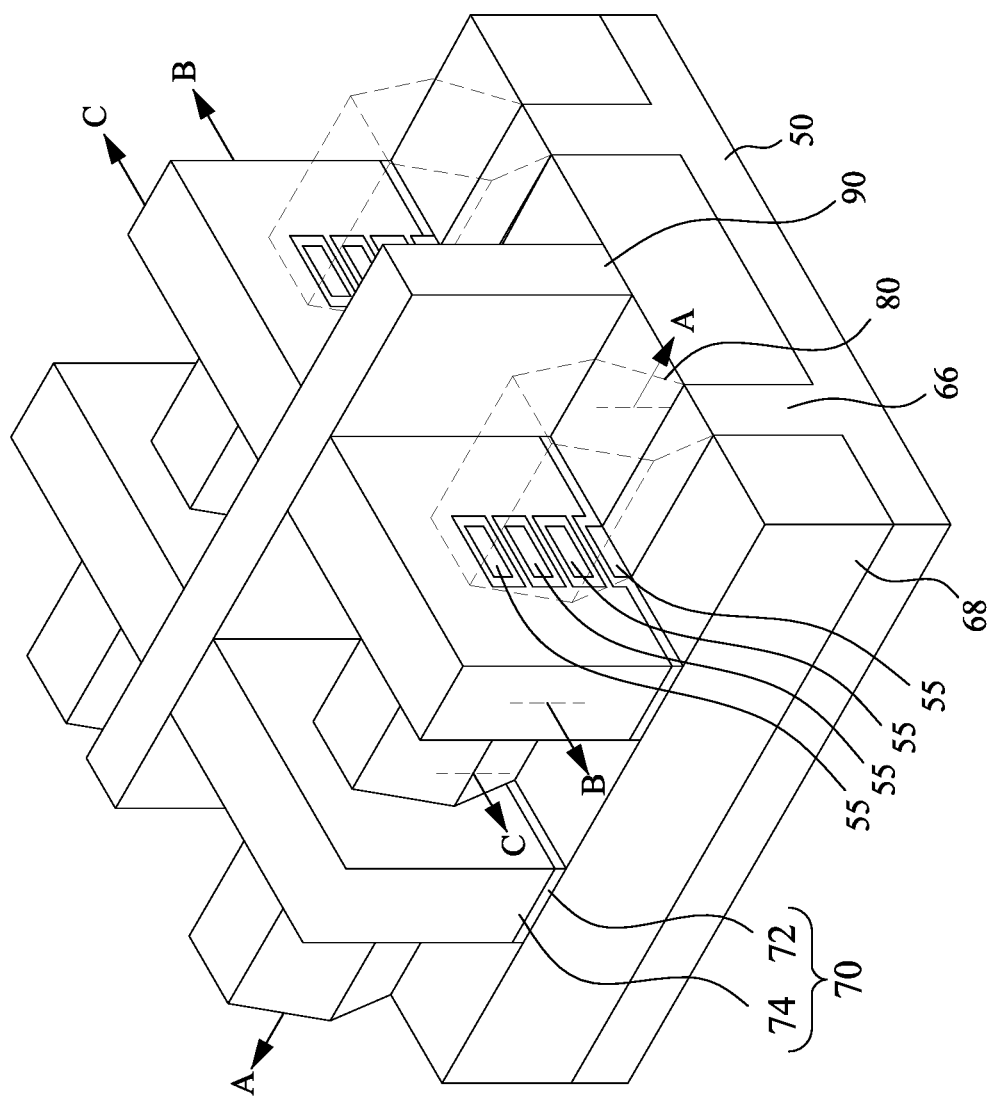
FIG. 1 illustrates an example of nano-FETs in a three-dimensional view in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation structures 68 are disposed between adjacent fins 66, which may protrude above and from between neighboring isolation structures 68. Additionally, although a bottom portion of the fins 66 are illustrated as being single, continuous materials with the substrate 50, the bottom portion of the fins 66 and/or the substrate 50 may include a single material or a plurality of materials. In this context, the fins 66 refer to the portion extending between the neighboring isolation structures 68.

Gate dielectric layers 72 are over the fins 66 and along top surfaces, sidewalls, and bottom surfaces of the nanostructures 55. Gate electrodes 74 are over the gate dielectric layers 72. The gate dielectric layer 72 and the gate electrode 74 can be collectively referred to as a gate structure 70.

Epitaxial source/drain structures 80 are disposed over the fins 66, and on opposing sides of the gate structure 70. The gate structure 70 serves as a gate region of the transistor, the epitaxial source/drain structures 80 serve as source/drain regions of the transistor, and the nanostructures 55 serve as channel region of the transistor.

An isolation structure 90 is disposed over the isolation structures 68 and separates at least two adjacent gate structures 70. Although the isolation structure 90 is illustrated as being single, continuous material, the isolation structure 90 may include a plurality of layers and/or materials.

FIG. 1 further illustrates reference cross-sections that are used in later figures. Cross-section A-A is parallel to a longitudinal axis of a fin 66 of the nano-FET and in a direction of, for example, a current flow between the epitaxial source/drain structures 80 of the nano-FET. Cross-section B-B is along a longitudinal axis of a gate structure 70 and in a direction, for example, perpendicular to the direction of current flow between the epitaxial source/drain structures 80 of a nano-FET. Cross-section C-C is parallel to cross-section B-B and extends through epitaxial source/drain structures 80 of the nano-FET of the nano-FETs. Subsequent figures refer to these reference cross-sections for clarity.

FIGS. 2A through 19C are cross-sectional views of intermediate stages in the manufacturing of a semiconductor device, in accordance with some embodiments. FIGS. 2A-19A illustrate reference cross-section A-A illustrated in FIG. 1. FIGS. 2B-19B illustrate reference cross-section B-B illustrated in FIG. 1. FIGS. 2C-19C illustrate reference cross-section C-C illustrated in FIG. 1.

Figure 2B:
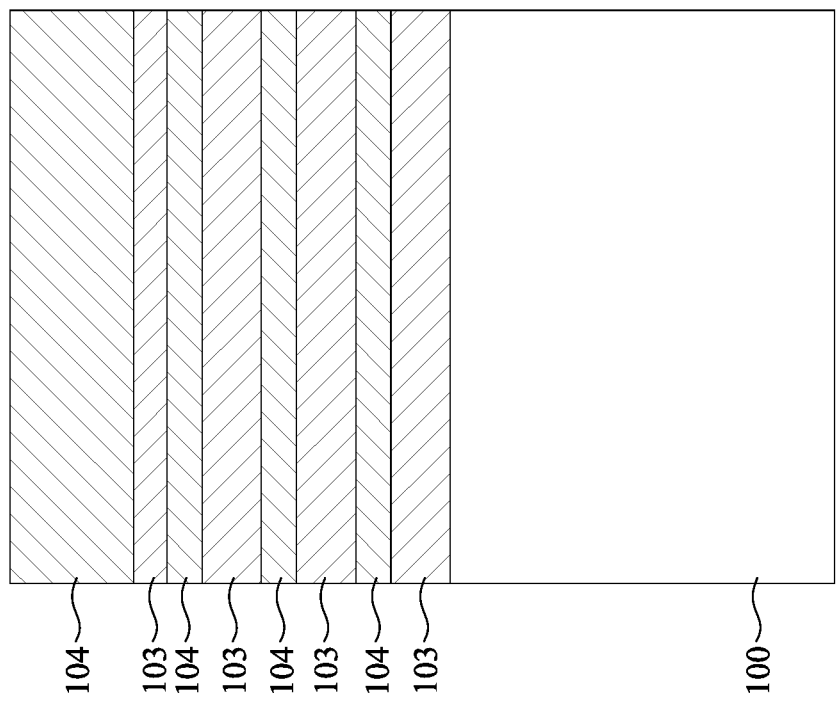
FIGS. 2A through 19D are cross-sectional views of intermediate stages in the manufacturing of a semiconductor device, in accordance with some embodiments.
Figure 2A:
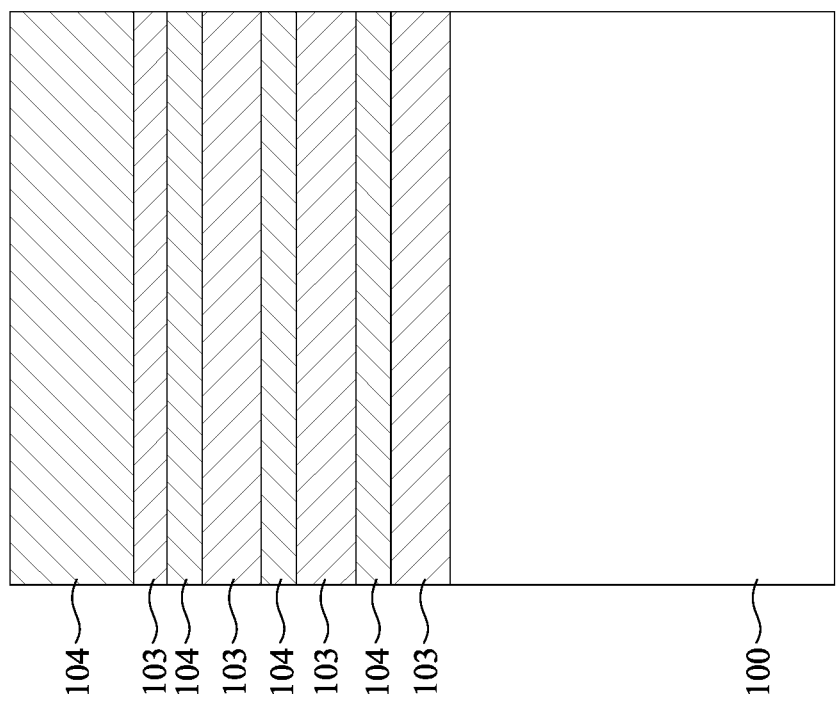
Figure 2C:
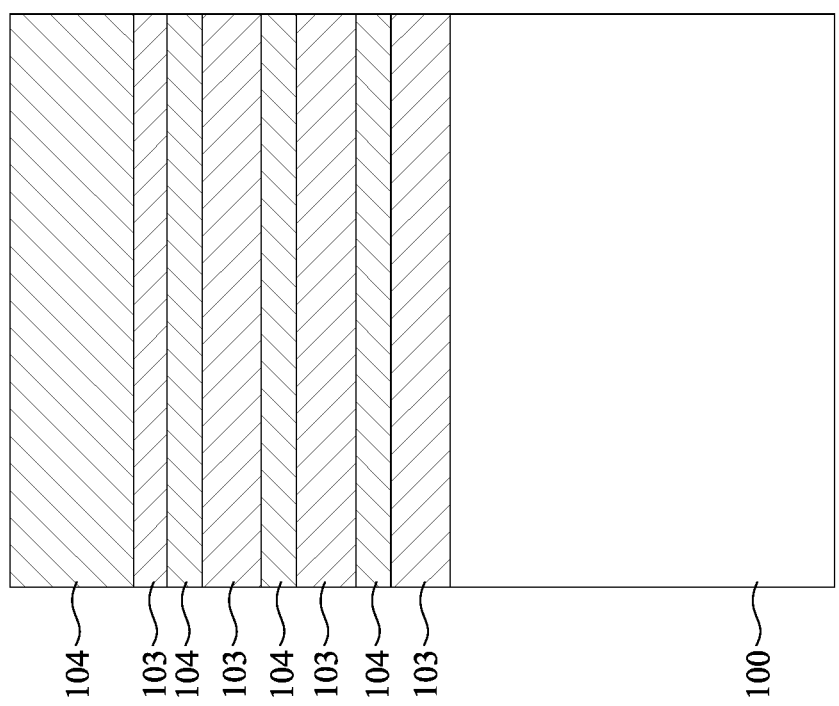

Reference is made to FIGS. 2A to 2C, shown there is a substrate 100. Generally, the substrate 100 illustrated in FIGS. 2A to 2C may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

Further in FIGS. 2A to 2C, a plurality of semiconductor layers 103 and semiconductor layers 104 are alternately deposited over the substrate 100. The semiconductor layers 103 and the semiconductor layers 104 have different materials and/or components, such that the semiconductor layers 103 and the semiconductor layers 104 have different etching rates. In some embodiments, the semiconductor layers 103 are made from SiGe. The germanium percentage (atomic percentage concentration) of the semiconductor layers 103 is in the range between about 10 percent and about 20 percent, while higher or lower germanium percentages may be used. It is appreciated, however, that the values recited throughout the description are examples, and may be changed to different values. For example, the semiconductor layers 103 may be $Si_{0.8}Ge_{0.2}$ or $Si_{0.9}Ge_{0.1}$, in which the proportion between Si and Ge may vary from embodiments, and the disclosure is not limited thereto. The semiconductor layers 104 may be pure silicon layers that are free of germanium. The semiconductor layers 104 may also be substantially pure silicon layers, for example, with a germanium percentage lower than about 1 percent. In some embodiments, the semiconductor layers 103 have a higher germanium atomic percentage concentration than the semiconductor layers 104. The semiconductor layers 103 and 104 may be formed by chemical vapor deposition (CVD), molecular beam epitaxy (MBE), or other suitable process(es). In some embodiments, the semiconductor layers 103 and 104 are formed by an epitaxy growth process, and thus the semiconductor layers 103 and 104 can also be referred to as epitaxial layers in this content.

Figure 3B:
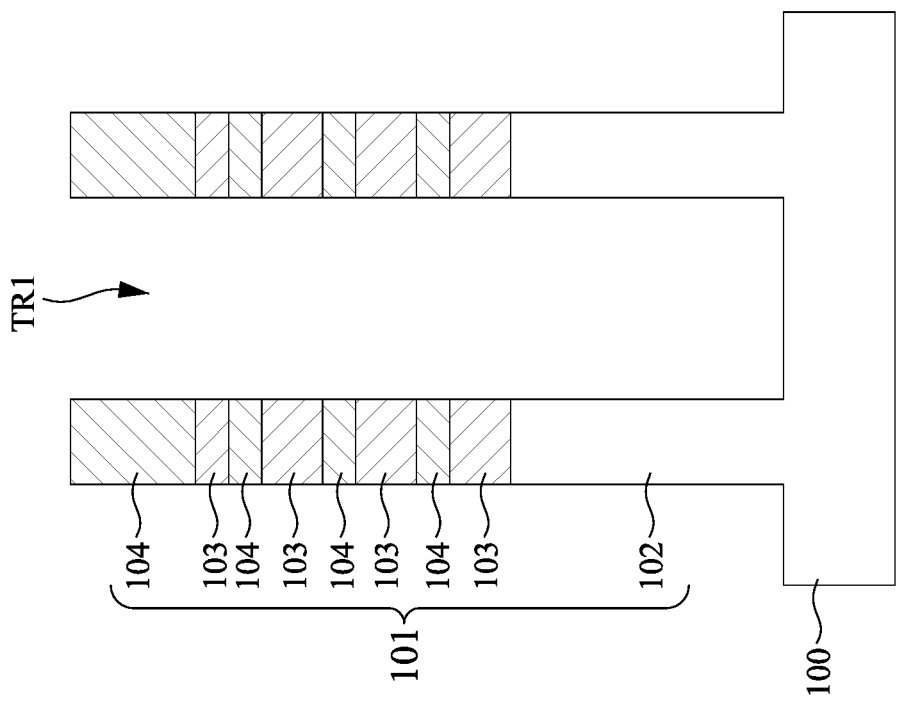
Figure 3A:
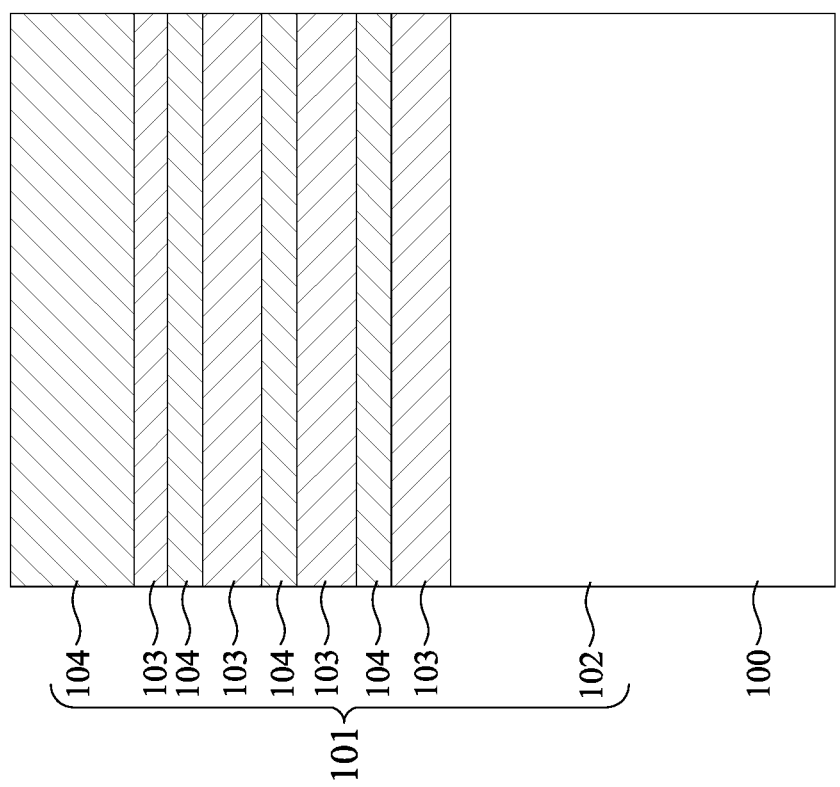
Figure 3C:
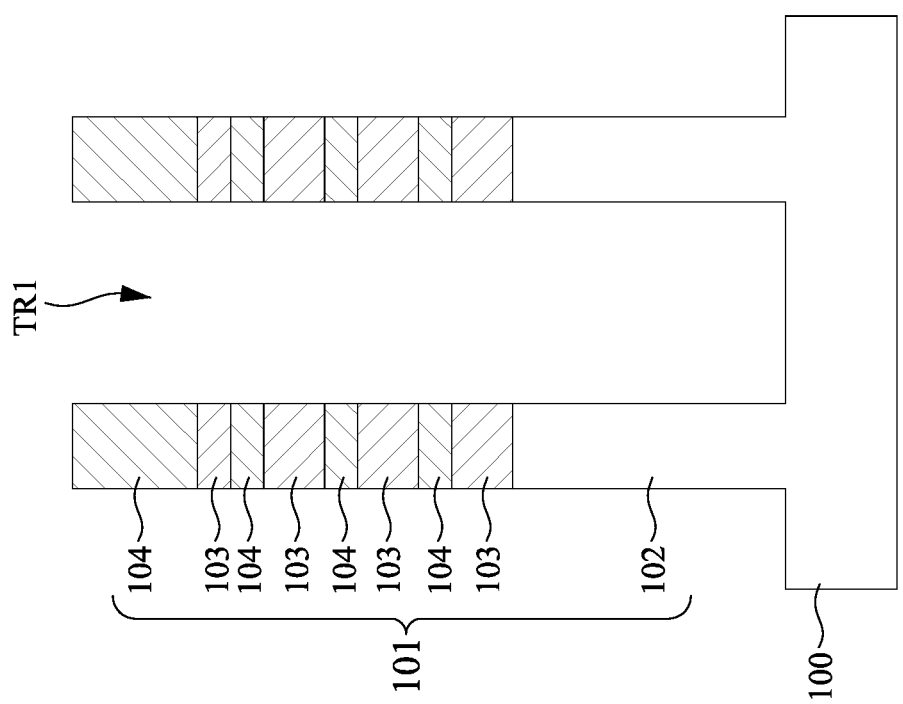

Reference is made to FIGS. 3A to 3C. The semiconductor layers 103, 104 and the substrate 100 are patterned to form trenches TR1. As a result of the patterning process, semiconductor strips 102 are formed protruding over the substrate 100. In some embodiments, the semiconductor layers 103, 104 and the substrate 100 may be patterned using suitable processes including photolithography and etch processes. In some embodiments, each semiconductor strip 102 and the overlying semiconductor layers 103 and 104 can be collectively referred to as a semiconductor fin 101.

Figure 4B:
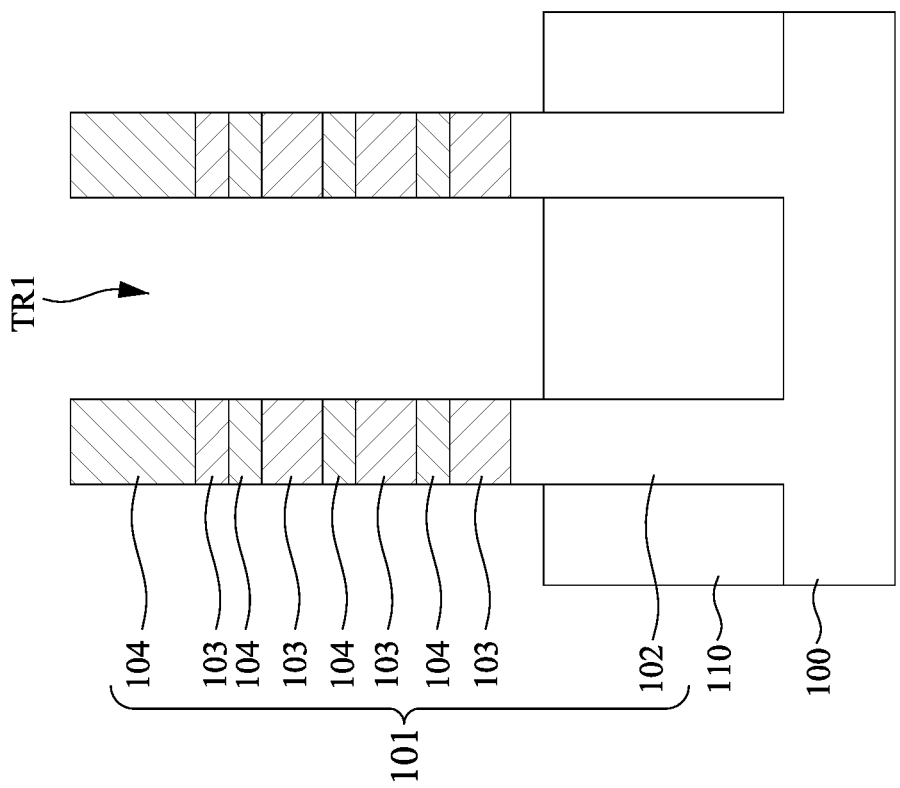
Figure 4A:
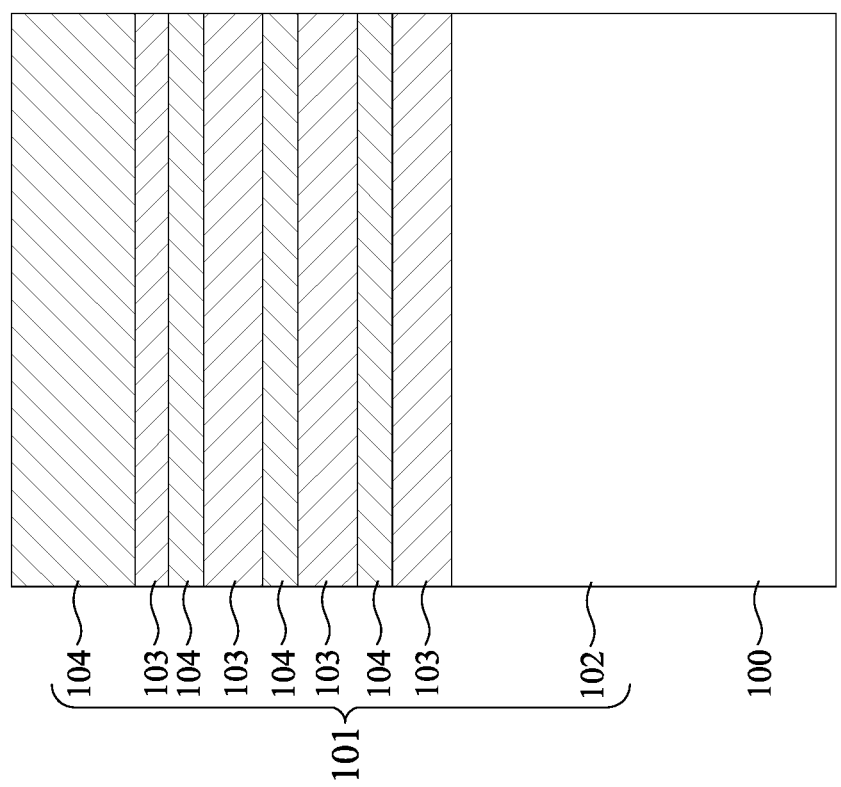

Reference is made to FIGS. 4A to 4C. Isolation structures 110 are formed over the substrate 100 and laterally surrounding the semiconductor strips 102. The isolation structures 110 may be shallow trench isolation (STI) structures, suitable isolation structures, combinations of the foregoing, or the like. In some embodiments, the isolation structures 110 may be made of oxide (e.g., silicon oxide) or nitride (e.g., silicon nitride). In some other embodiments, each of the isolation structures 110 may include a dielectric layer and a dielectric liner lining the dielectric layer, in which the dielectric liner and the dielectric layer are made of different materials, for example, the dielectric liner may be silicon nitride, and the dielectric layer may be silicon oxide. In some embodiments, the isolation structures 110 may be formed by, for example, depositing dielectric material(s) over the substrate 100 and overfilling the trenches TR1, performing a chemical mechanism polishing (CMP) process to the dielectric material(s), and etching back the dielectric material(s) until top portions of sidewalls of the semiconductor strips 102 are exposed.

Figure 5B:
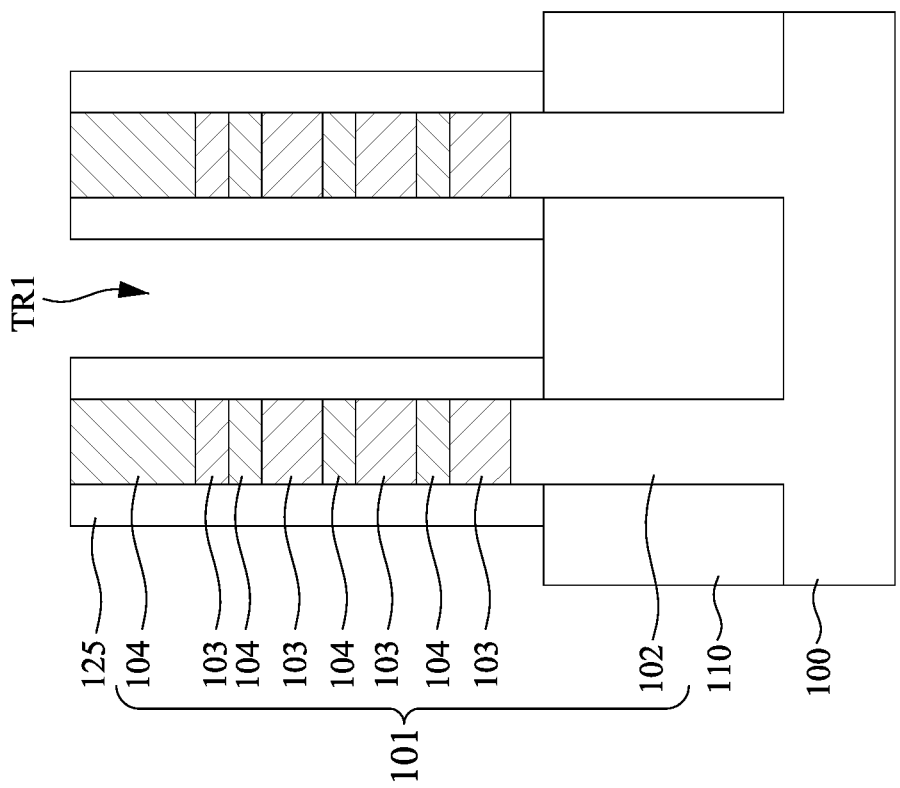
Figure 5A:
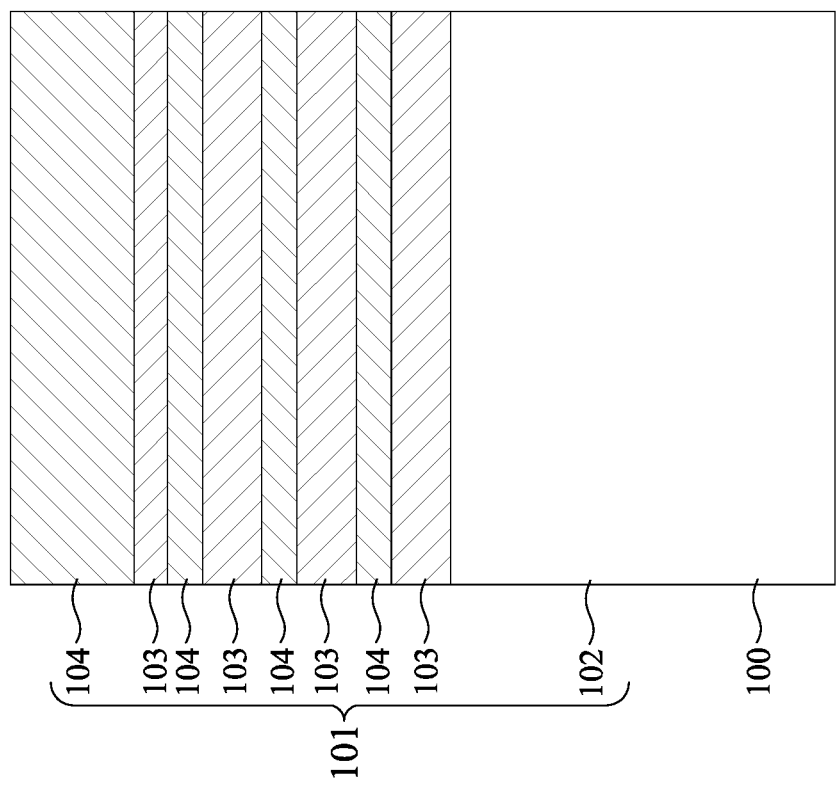
Figure 5C:
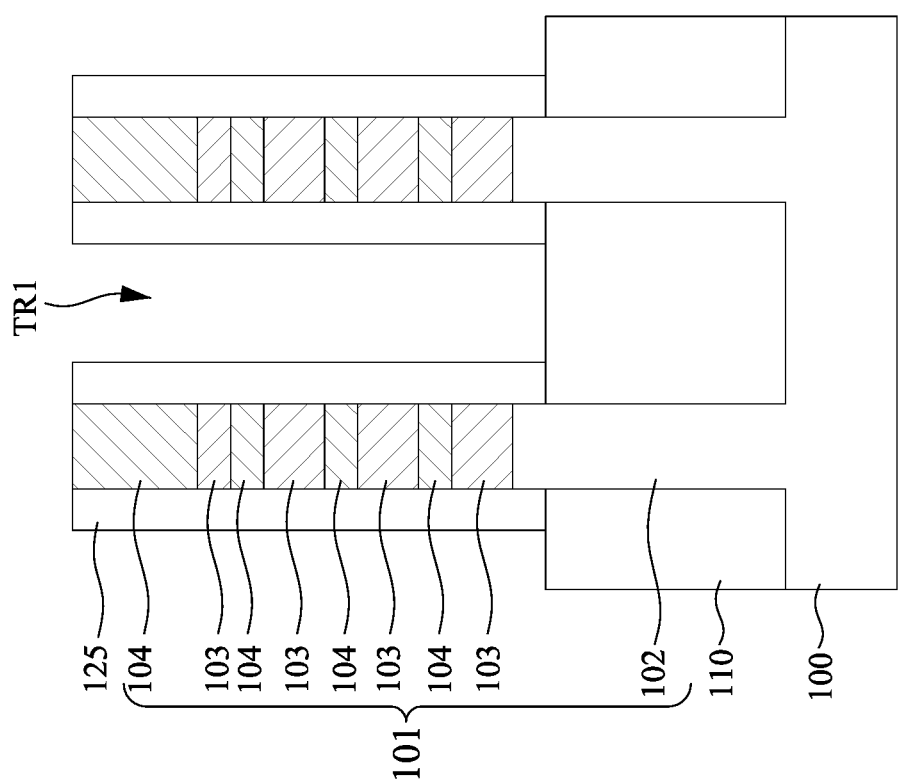

Reference is made to FIGS. 5A to 5C. Semiconductor layers 125 are formed along sidewalls of the semiconductor layers 103, 104, and along sidewalls of the semiconductor strips 102. In some embodiments, the semiconductor layers 125 may also be referred to as isolation films. The semiconductor layers 125 may include silicon (Si) or silicon germanium (SiGe). In some embodiments, the semiconductor layers 125 may be formed by, for example, depositing a semiconductor layer conformally over the structure of FIGS. 4A to 4C, and performing an etching process to remove horizontal portions of the semiconductor layer, such that the vertical portions of the semiconductor layer remain on sidewalls of the semiconductor layers 103, 104, and on sidewalls of the semiconductor strips 102. In some embodiments, the semiconductor layer 125 may be formed by CVD, PVD, ALD, or other suitable deposition processes.

Figure 6B:
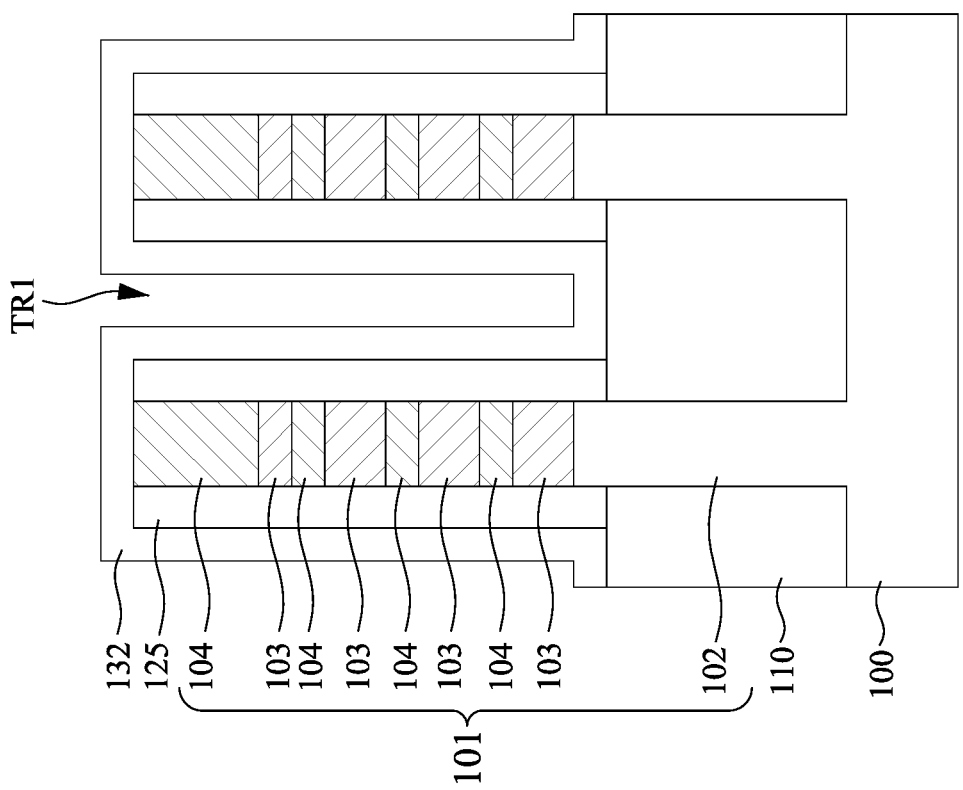
Figure 6A:
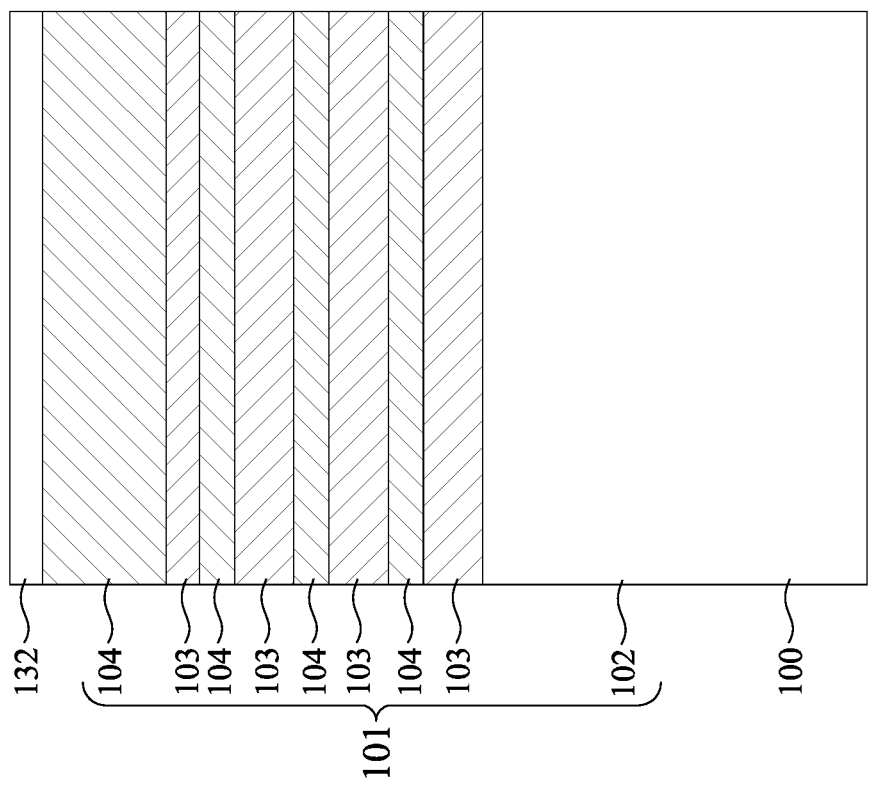
Figure 6C:
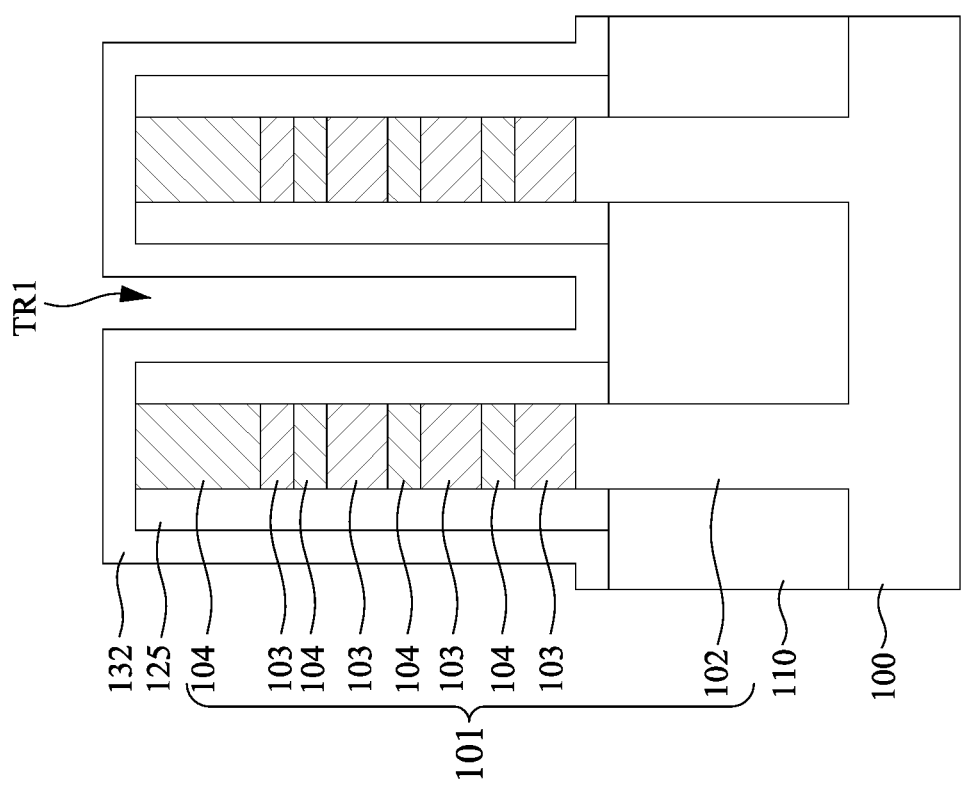

Reference is made to FIGS. 6A to 6C. An isolation film 132 is deposited conformally over the structure of FIGS. 5A to 5C. In some embodiments, the isolation film 132 may be made of a dielectric material. In particular, the isolation film 132 may be made of a nitride-based material, such as SiCN, SiON, SiCON, or the like. In some embodiments, the isolation film 132 may be deposited by suitable deposition process, such as CVD, PVD, ALD, or other suitable deposition processes.

Figure 7B:
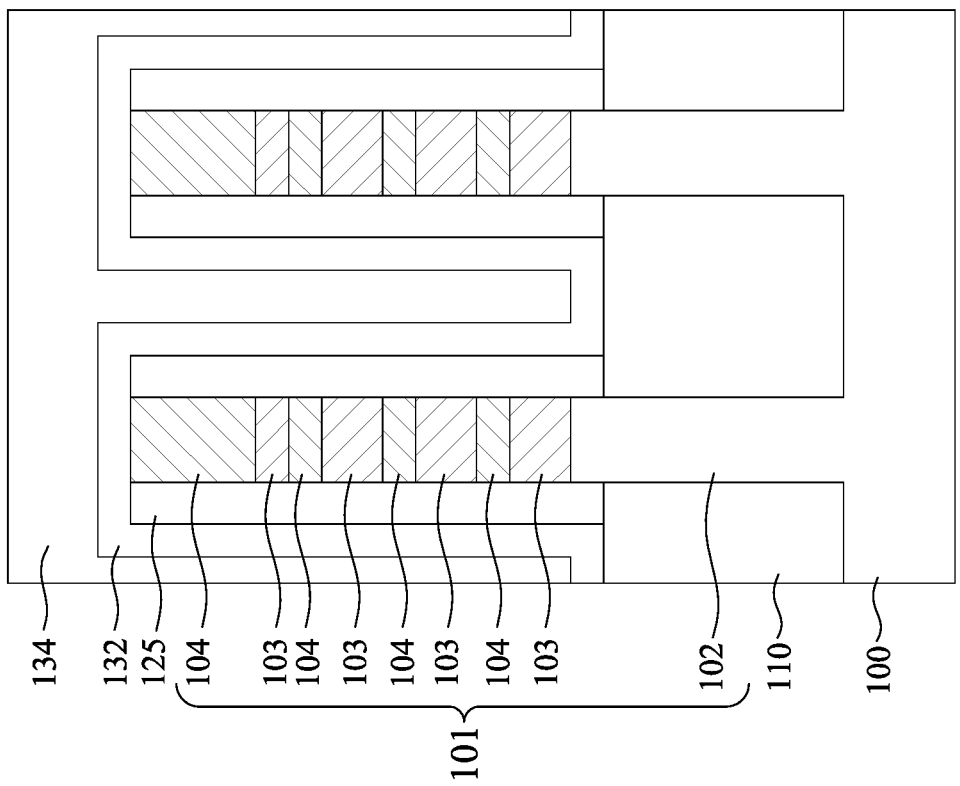
Figure 7A:
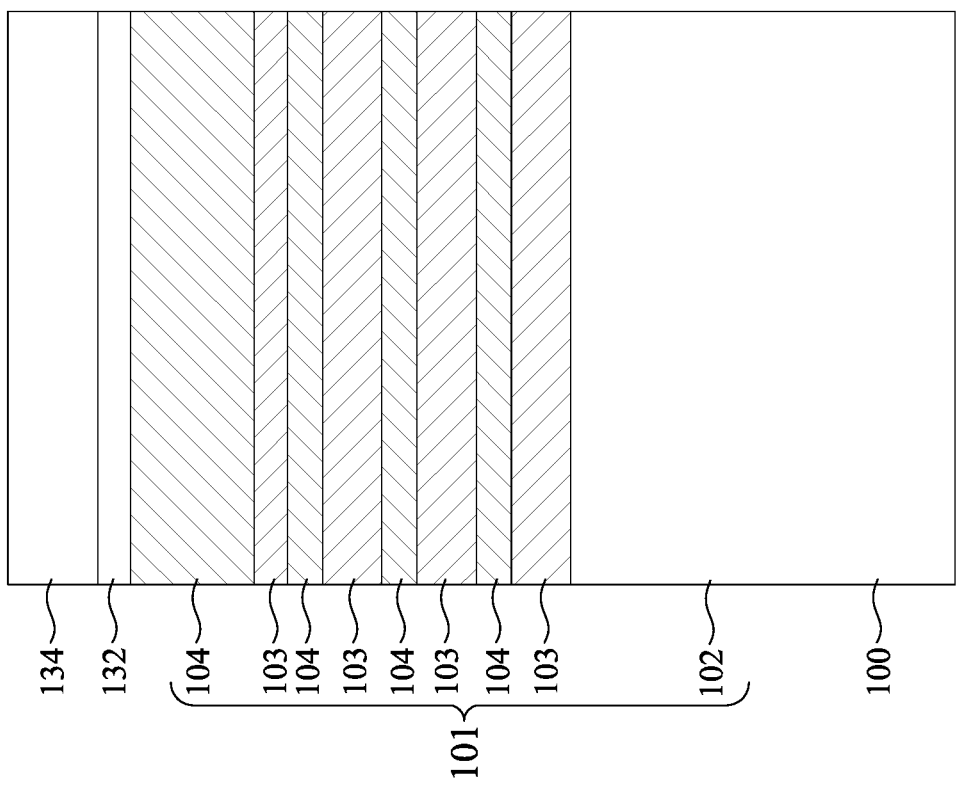
Figure 7C:
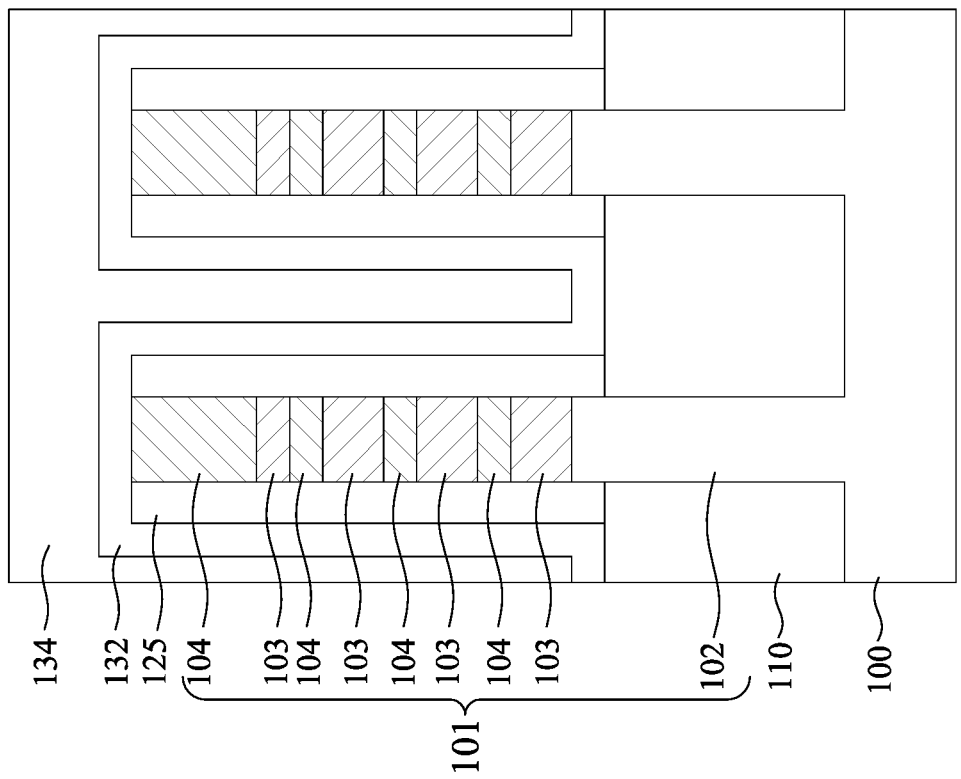

Reference is made to FIGS. 7A to 7C. An isolation film 134 is deposited over the isolation film 132. In some embodiments, the isolation film 134 may be made of a dielectric material. In particular, the isolation film 134 may be made of an oxide-based material, such as $SiO_2$, or the like. In some embodiments, the isolation film 134 is made of a different material than the isolation film 132, so as to provide sufficient etching selectivity between the two layers.

Figure 8B:
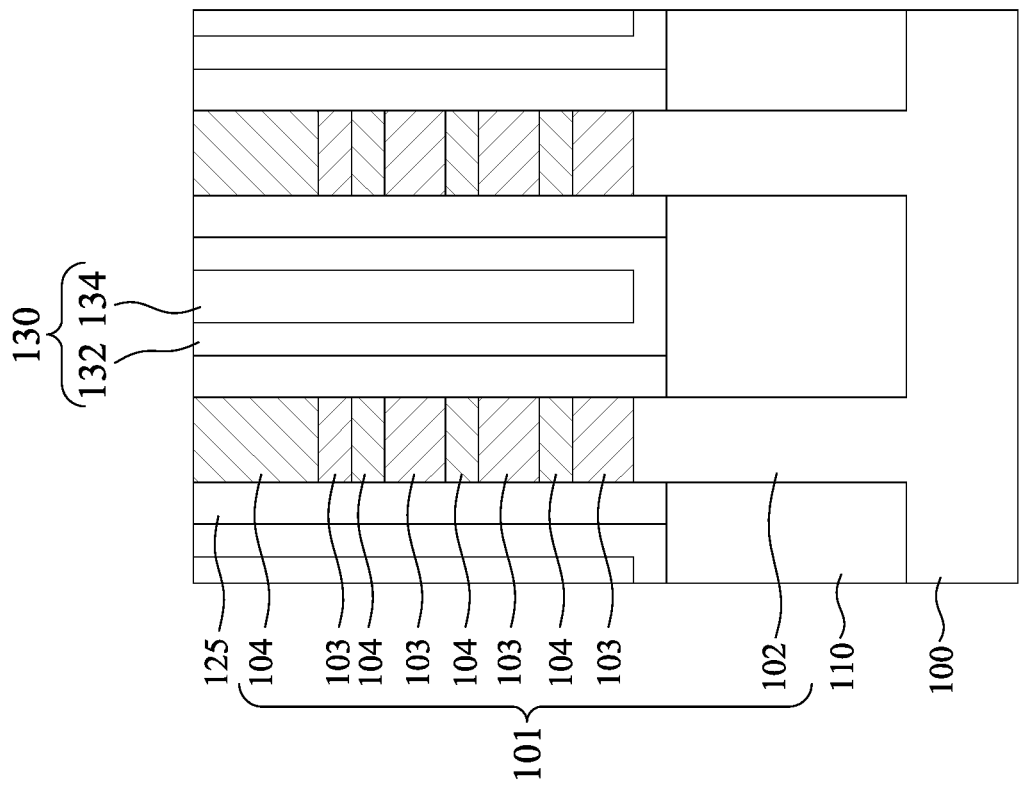
Figure 8A:
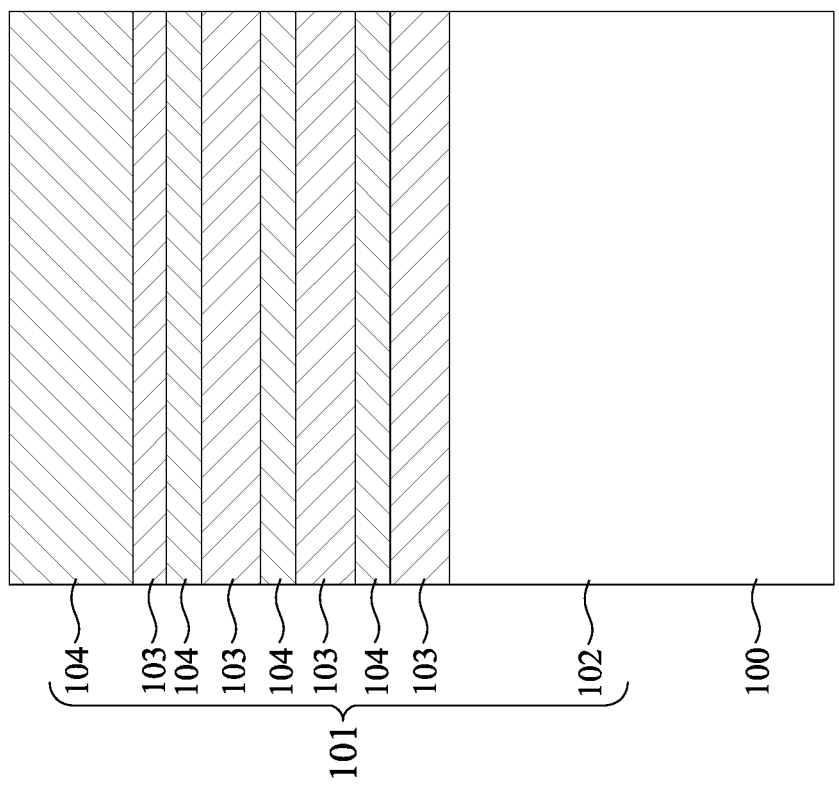
Figure 8C:
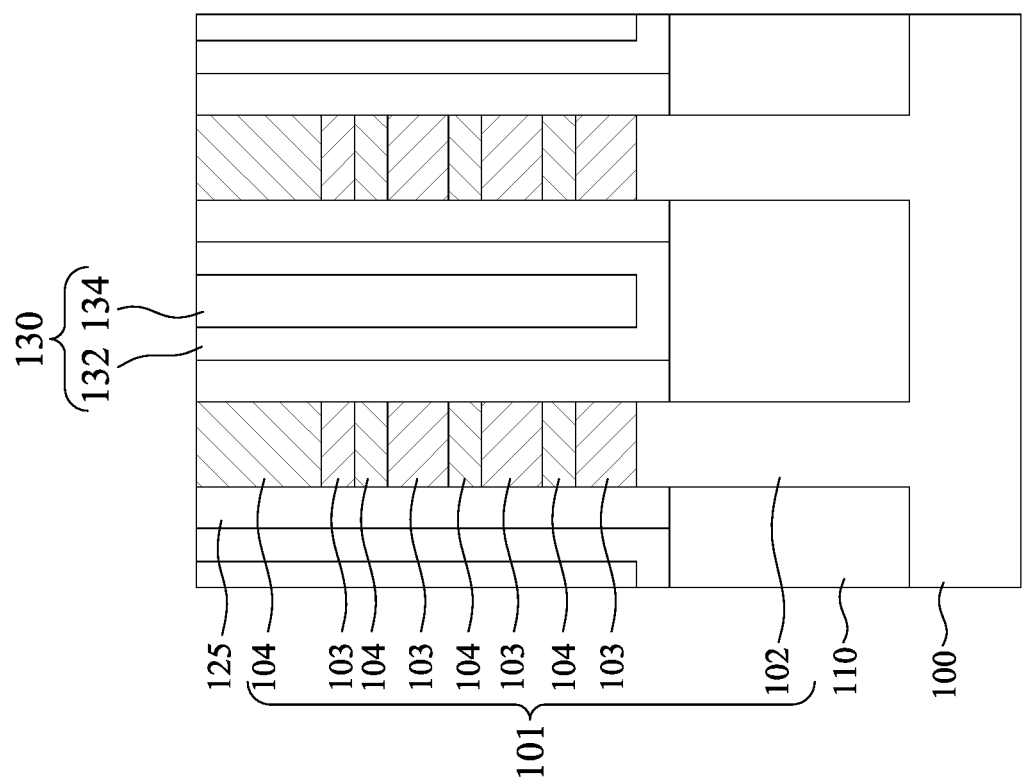

Reference is made to FIGS. 8A to 8C. A CMP process is performed to remove excess materials of the isolation films 132 and 134 until the top surfaces of the topmost semiconductor layers 104 are exposed. After the CMP process is completed, top surfaces of the isolation films 132 and 134 are substantially level with the top surface of the topmost semiconductor layer 104. In some embodiments, the isolation films 132 and 134 can be collectively referred to as an isolation structure 130.

Figure 9B:
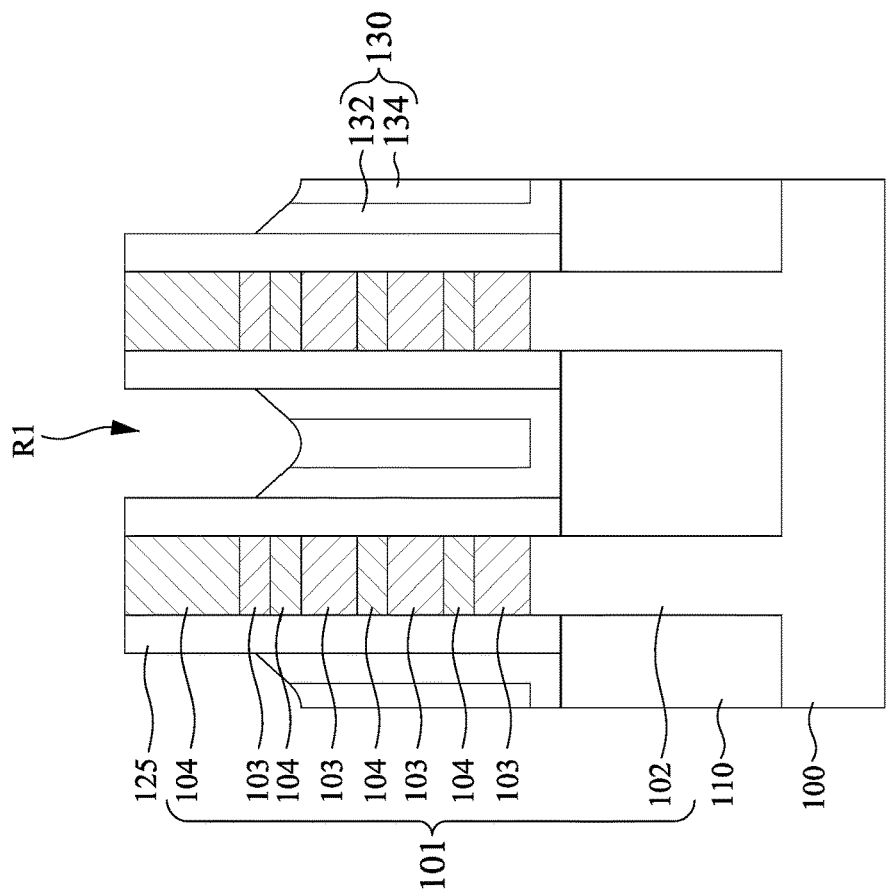
Figure 9A:
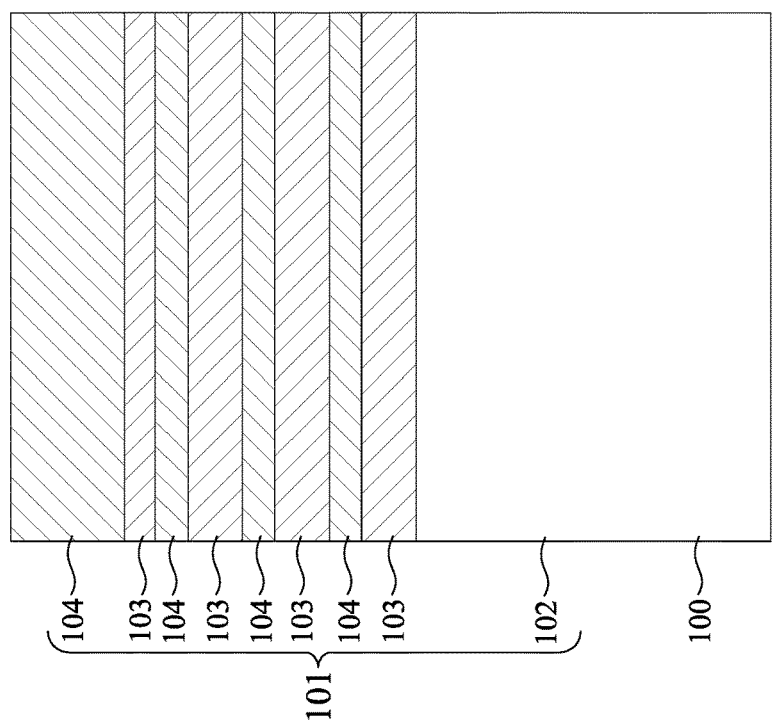
Figure 9C:
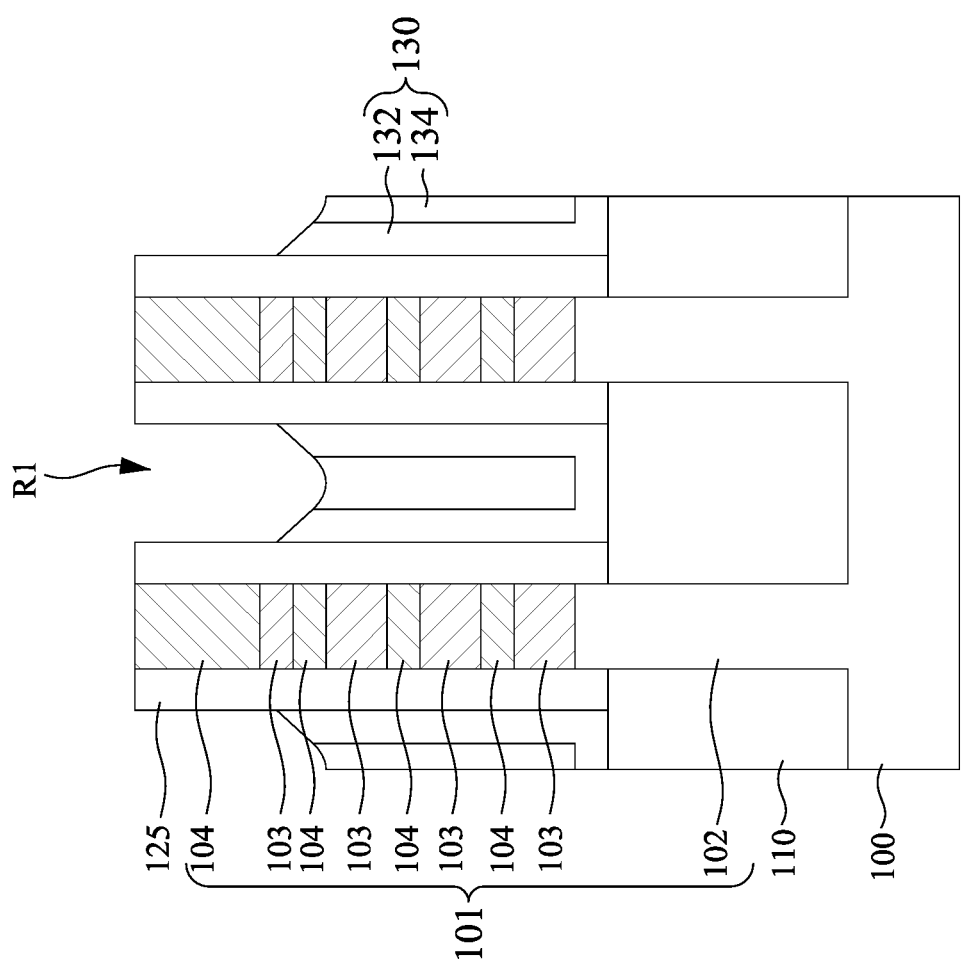

Reference is made to FIGS. 9A to 9C. An etching back process is performed to etch back the isolation films 132 and 134, such that top surfaces of the isolation films 132 and 134 are lower to positions below the top surfaces of the topmost semiconductor layers 104. In some embodiments, during the etching back process, the topmost semiconductor layer 104 and the semiconductor layers 125 have higher etching resistance to the etchant of the etching back process, such that the semiconductor layer 104 and the semiconductor layers 125 are substantially intact or negligibly etched after the etching back process. After the etching back process is completed, a plurality of recesses R1 are formed.

Figure 9D:
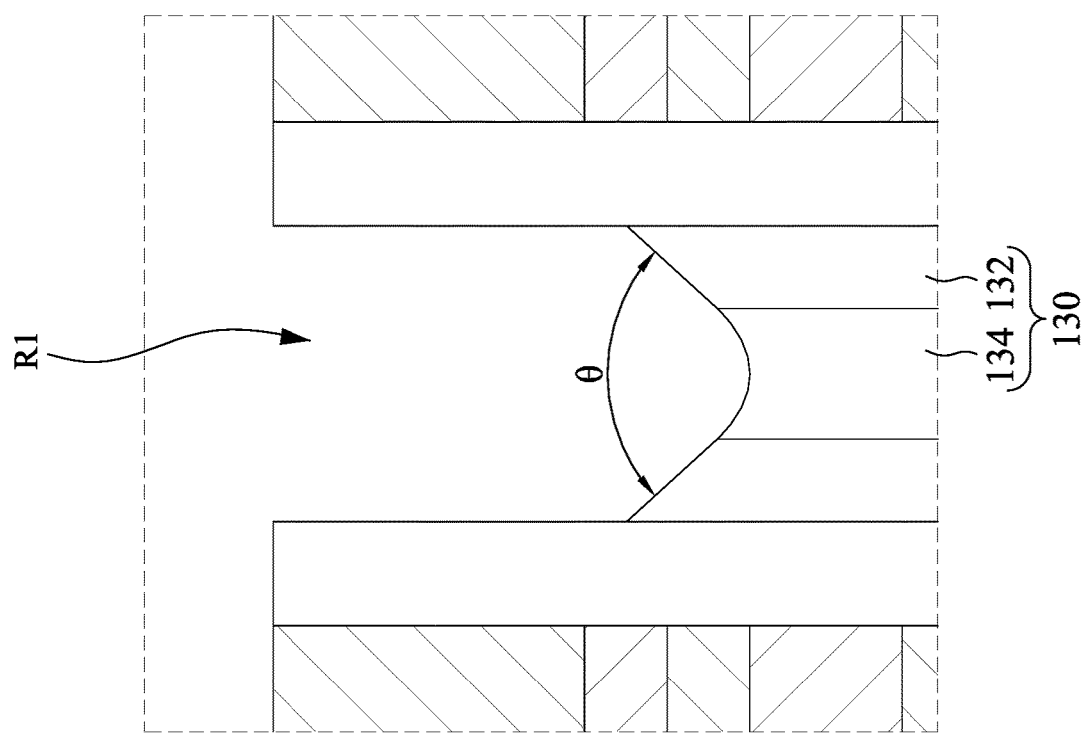

Reference is made to FIG. 9D, in which FIG. 9D is an enlarged view of recess R1 in the middle of FIGS. 9B and 9C (e.g., the recess R1 between two semiconductor strips 102). The recess R1 has a bottom tip having an angle θ in a range from about 60° to about 179°. In some other embodiments, the angle θ of the bottom tip of the recess R1 may be in a range from about 85° to about 95°, such as 90°. Because isolation films 132 and 134 are made of different materials, the profile of the bottom tip of the recess R1 is due to the etching selectivity between the isolation films 132 and 134 during the etching back process. In some embodiments, the isolation film 132 has a higher etching resistance to the etching back process than the isolation film 134. Stated another way, the etching back process has a higher etching rate to the isolation film 134 than to the isolation film 132. As a result, the isolation film 134 is pulled back to a position even lower than the isolation film 132. That is, after the etching back process is completed, a bottommost end of the isolation film 134 is lower than a bottommost end of the isolation film 132. From another view point, after the etching back process is completed, the isolation film 132 has inclined top surfaces. On the other hand, the isolation film 134 has a concave top surface.

Figure 20:
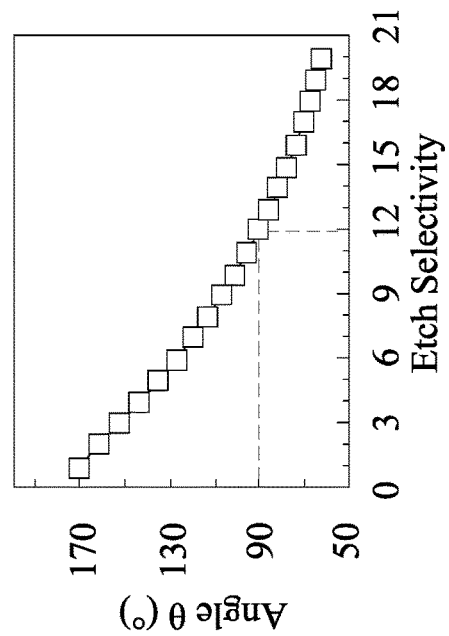
FIG. 20 shows experiment results in accordance with some embodiments of the present disclosure.

FIG. 20 shows experiment results of the etching back process discussed in FIGS. 9A to 9D in accordance with some embodiments of the present disclosure. It is shown that when the etching selectivity between the isolation films 132 and 134 increases, the tip angle θ of the recess R1 decreases accordingly. In some embodiments where the etching selectivity between the isolation films 132 and 134 is around 12, the angle θ of the bottom tip of the recess R1 may be in a range from about 85° to about 95°, such as 90°, which will facilitate the formation of air gap (e.g., the air gap AG of FIGS. 10B and 10C) formed in later step. In some embodiments, the etching selectivity between the isolation films 132 and 134 can be expressed as: etching selectivity=etch rate$_{isolation\ films\ 132}$/etch rate$_{isolation\ films\ 132}$.

Figure 10C:
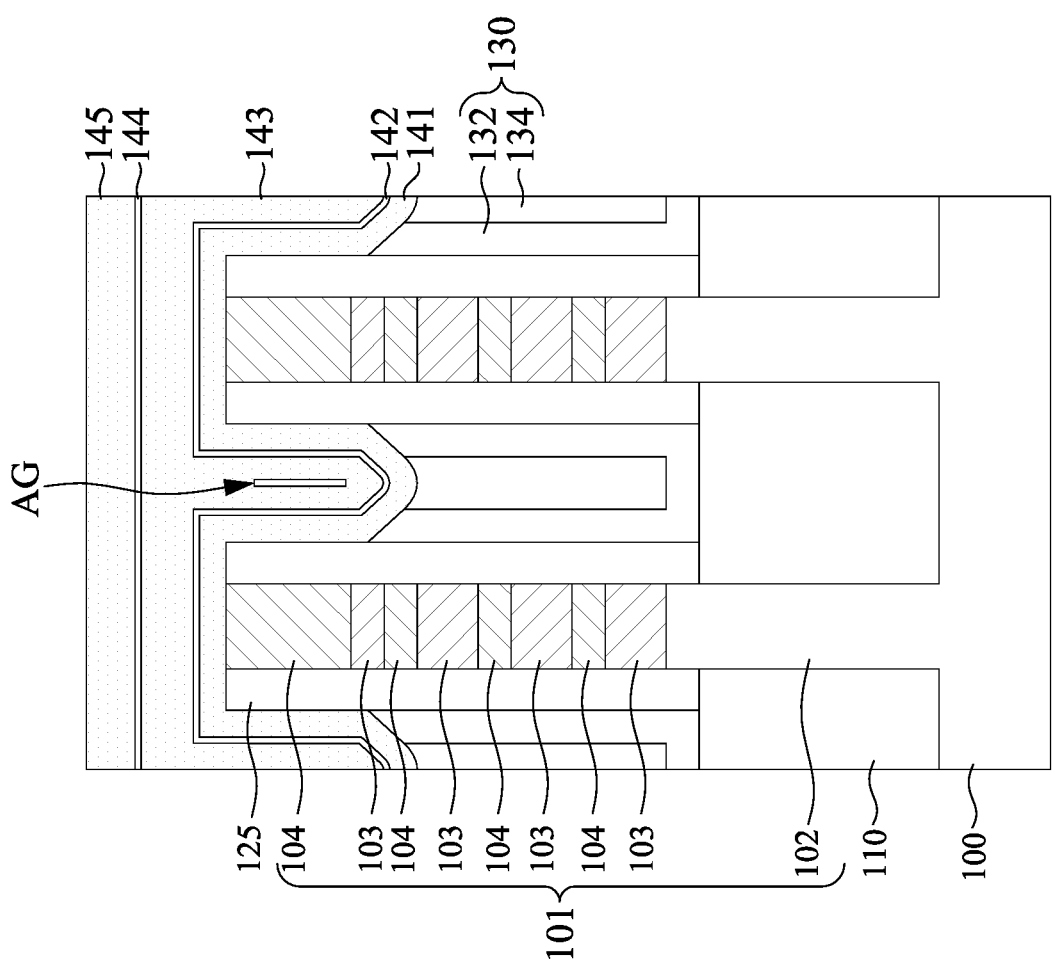

Reference is made to FIGS. 10A to 10C. A metal oxide layer 141, an oxide layer 142, a metal oxide layer 143, an oxide layer 144, and a metal oxide layer 145 are sequentially deposited over the substrate 100. In greater details, the metal oxide layer 141, the oxide layer 142, the metal oxide layer 143 are deposited filling the recesses R1 (see FIGS. 9B and 9C), which will serve as hard mask for protecting the underlying structure during a subsequent etching process.

In some embodiments, the metal oxide layers 141, 143, and 145 may be made of high-k dielectric materials, such as $ZrO_2$, $HfO_2$, or the like. In some embodiments, the oxide layers 142 and 144 may be made of dielectric materials, such as $SiO_2$, $Al_2O_3$, or the like. In some embodiments, the oxide layers 142 and 144 are free of metal element of the metal oxide layers 141, 143, and 145.

In some embodiments, the metal oxide layers 141, 143, and 145 each has higher dielectric constant than those of the oxide layers 142 and 144. For example, the dielectric constants of the metal oxide layers 141, 143, and 145 are in a range from about 10 to about 30, while the dielectric constants of the oxide layers 142 and 144 are in a range from about 2 to about 10.

In some embodiments, the metal oxide layers 141, 143, and 145 each has a thickness in a range from about 10 nm to about 40 nm. In some embodiments, the metal oxide layers 141, 143, and 145 are amorphous, and can be referred to as amorphous metal oxide layers throughout the content. The amorphous metal oxide layers 141, 143, and 145 will be crystallized in following steps, which is beneficial for lowering the effective k-value of the hard mask structure. If the thickness of the metal oxide layers 141, 143, and 145 is too small (e.g., much lower than 10 nm), the metal oxide layers 141 and 143 may not be thick enough to act as a protective layer. If the thickness of the metal oxide layers 141, 143, and 145 is too large (e.g., much greater than 40 nm), the metal oxide layers 141, 143, and 145 may be naturally crystallized into an unwanted phase during the deposition, which will deteriorate the device performance.

In some embodiments, the oxide layers 142 and 144 each has a thickness in a range from about 1 nm to about 1.5 nm. That is, the oxide layers 142 and 144 may be thinner than the metal oxide layers 141, 143, and 145. In some embodiments, the oxide layer 142 is an interposed layer between the metal oxide layers 141 and 143, and oxide layer 144 is an interposed layer between the metal oxide layers 143 and 145. Such configuration is beneficial for preventing the formation of unwanted crystallized metal oxide layer. For example, if the oxide layers 142 and 144 are omitted, a thick metal oxide layer will be deposited over the substrate 100 and filling the recesses R1, and will be naturally crystallized into an unwanted phase during the deposition. Accordingly, one advantage of forming the oxide layers 142 and 144 is that the oxide layers 142 and 144 can act as interposers which allow several thin amorphous metal oxide layers (e.g., the metal oxide layers 141, 143, and 145) to be formed. Another advantage of forming the oxide layers 142 and 144 is that the oxide layers 142 and 144 can lower the k-value of the resulting structure, which will improve the device performance.

During the deposition of the metal oxide layer 143, an air gap AG is formed in the metal oxide layer 143 within the recesses R1. This is because the bottom tip of the recesses R1 as discussed in FIGS. 9A to 9D, which is resulted from the etching selectivity between the isolation films 132 and 134 during the etching back process discussed in FIGS. 9A to 9D. For example, when the metal oxide layer 141 and the oxide layer 142 are deposited in the recesses R1, the middle region of each recess R1 is unoccupied. Because bottom tip of each recess R1 will increase aspect ratio of the unoccupied region of each recess R1, the metal oxide layer 143 will be deposited filling into a high aspect ratio recess, and thus the air gap AG may be easily formed. One advantage of forming the air gap AG is that the air gap AG can lower the k-value of the resulting structure, which will improve the device performance.

Figure 11B:
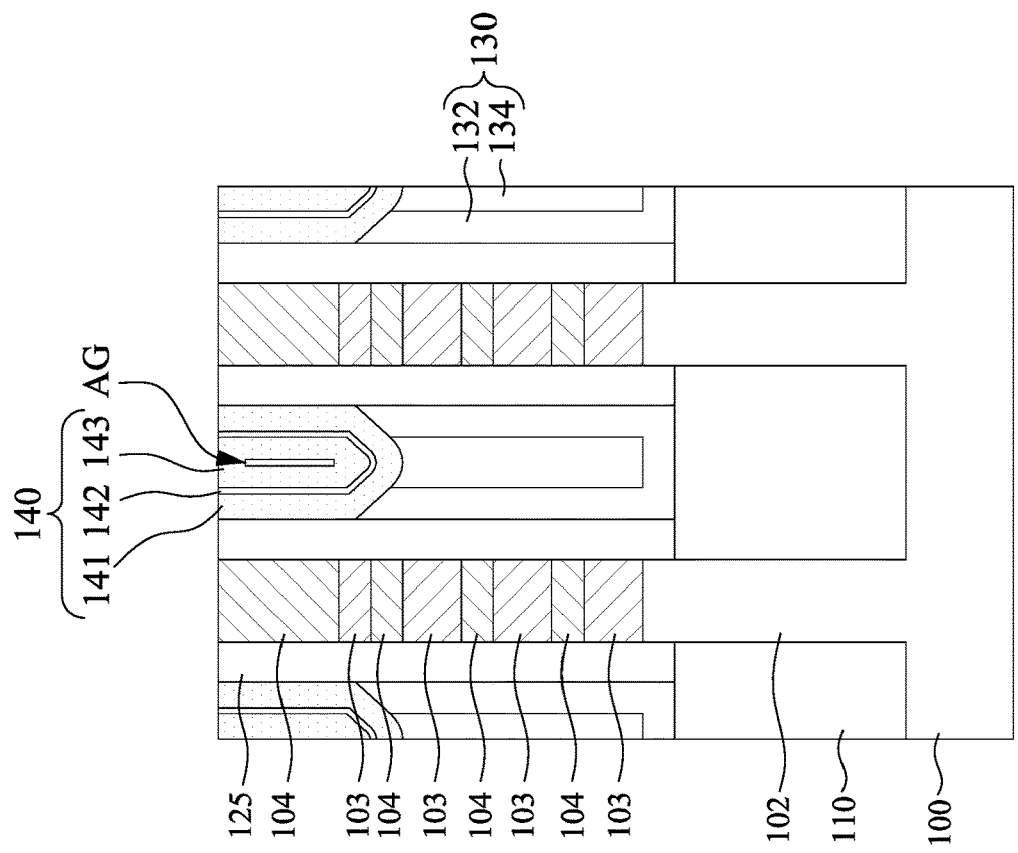
Figure 11A:
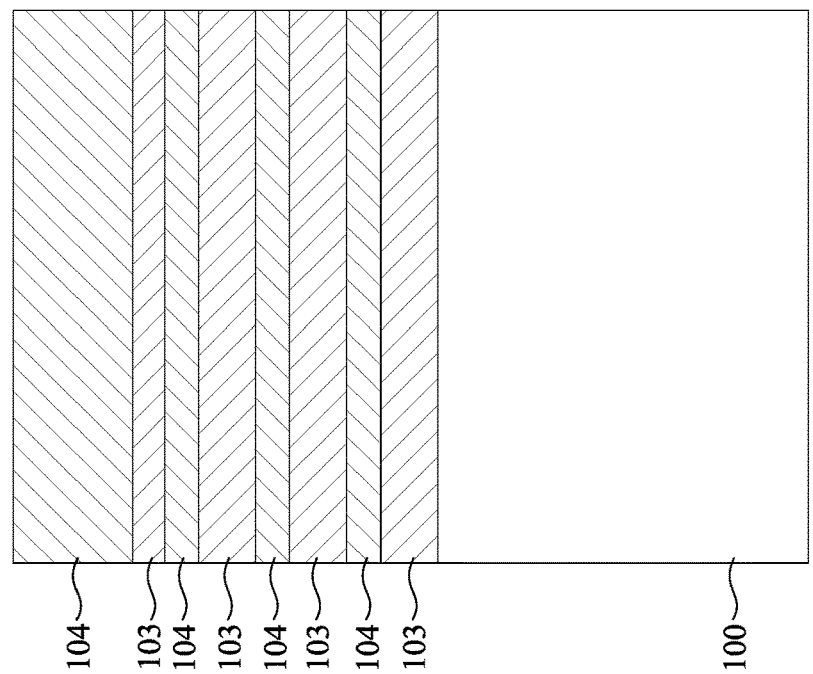
Figure 11C:
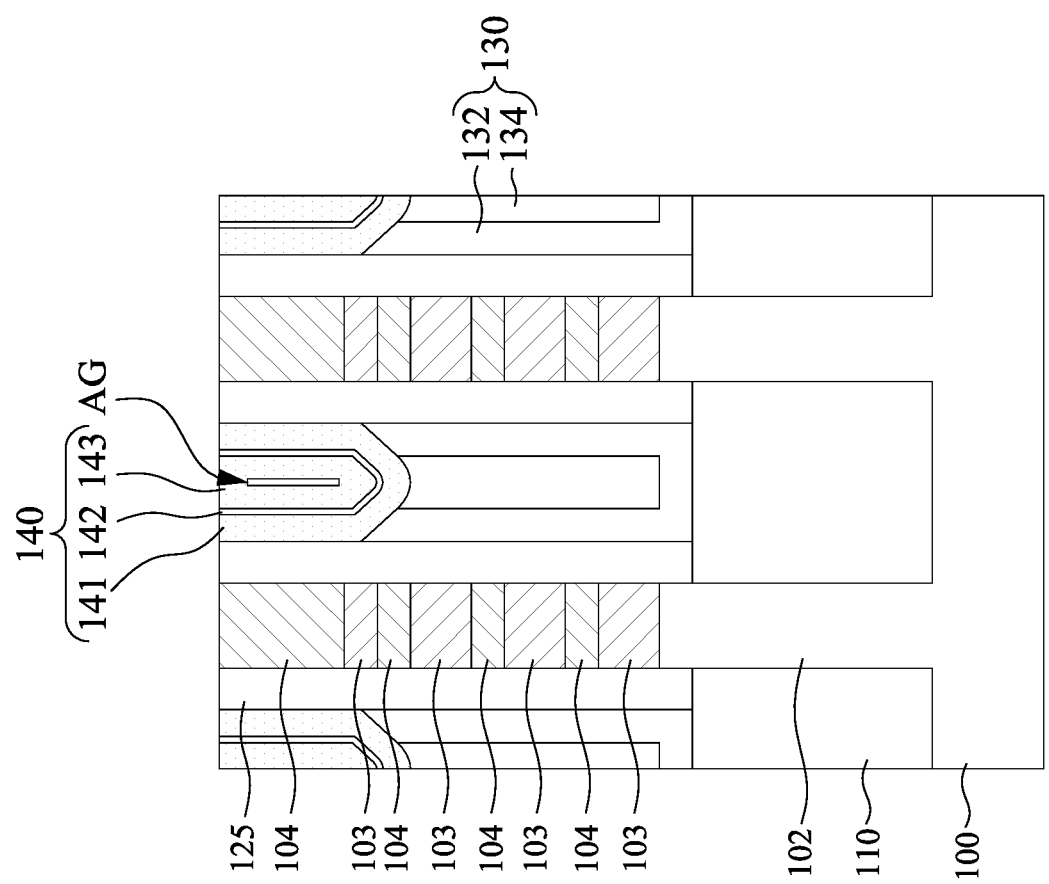

Reference is made to FIGS. 11A to 11C. A CMP process is performed to remove excess materials of the metal oxide layer 141, the oxide layer 142, the metal oxide layer 143, the oxide layer 144, and the metal oxide layer 145 until the top surfaces of the topmost semiconductor layers 104 are exposed. As a result of the CMP process, hard masks 140 are formed, in which each hard mask 140 includes remaining portions of the metal oxide layer 141, the oxide layer 142, and the metal oxide layer 143. In some embodiments, the oxide layer 144 and the metal oxide layer 145 may be completely removed from the substrate 100 during the CMP process, such that the hard masks 140 are free of materials of the oxide layer 144 and the metal oxide layer 145. In some embodiments, the hard masks 140 can be interchangeably referred to as capping layers throughout the content.

Figure 12B:
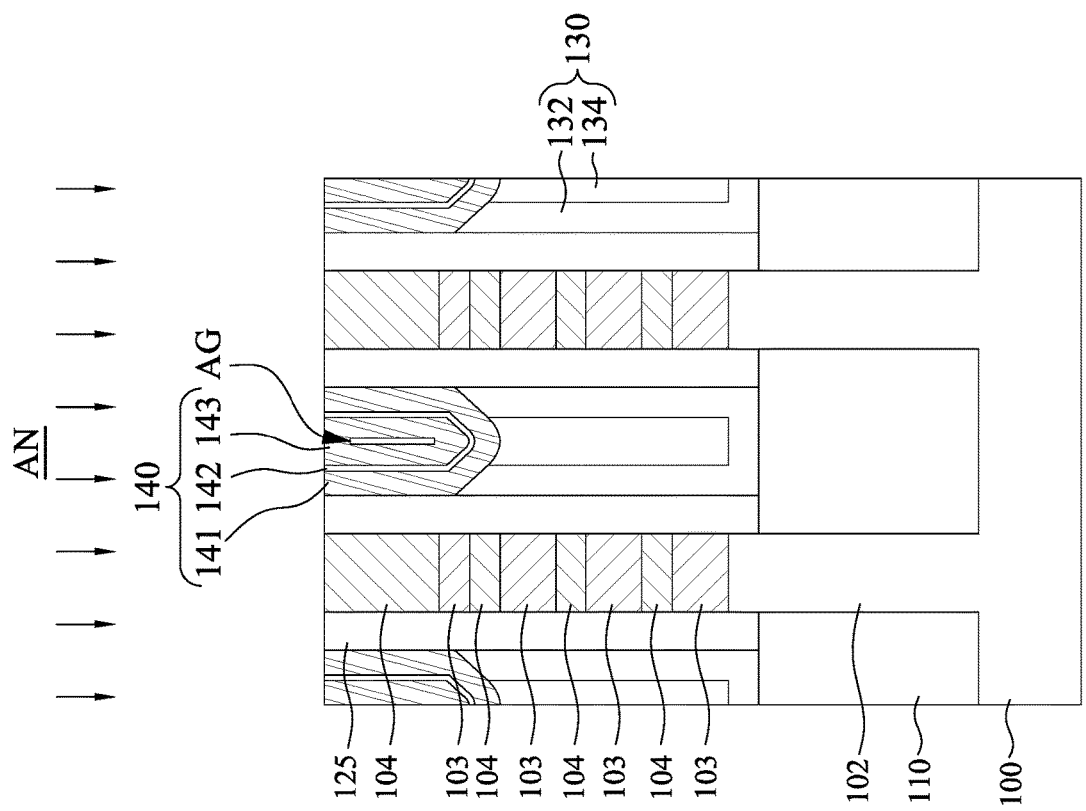
Figure 12A:
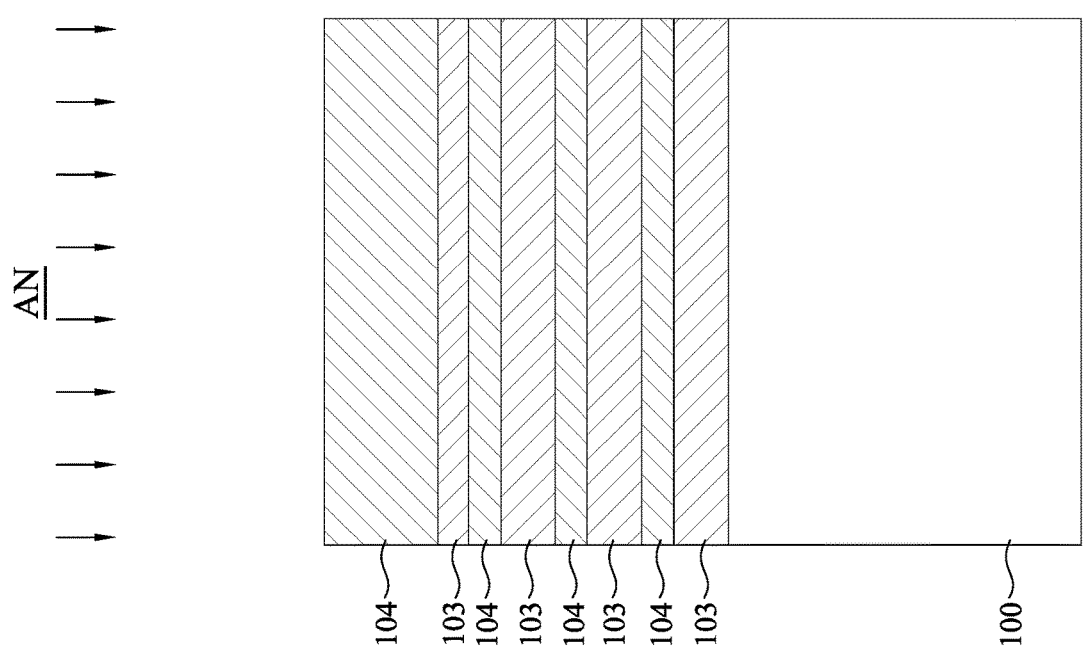
Figure 12C:
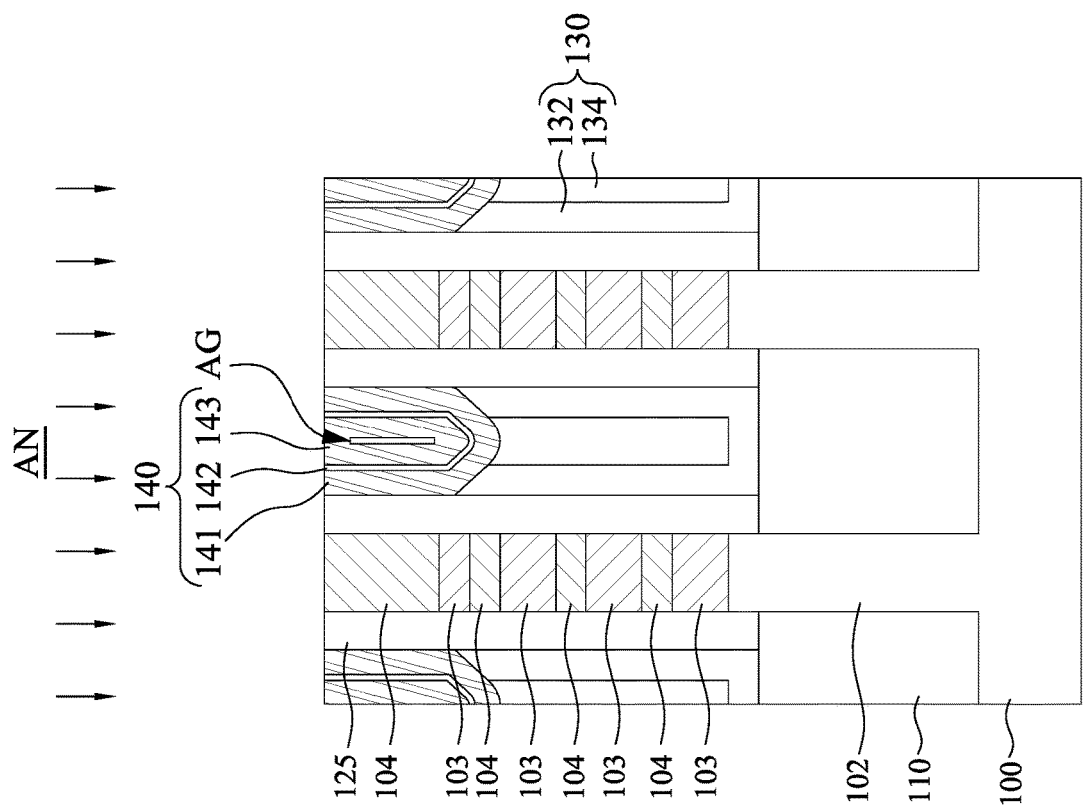

Reference is made to FIGS. 12A to 12C. An annealing process AN is performed to crystallize the metal oxide layers 141 and 143 of the hard masks 140. As mentioned above, the metal oxide layers 141 and 143 are deposited having amorphous structure, and the annealing process AN is performed to change the amorphous metal oxide layers 141 and 143 into desired crystalline phase. In some embodiments, the crystallized metal oxide layers 141 and 143 may include monoclinic phase, tetragonal phase, cubic phase, and orthorhombic phase. However, the dominated phase of the crystallized metal oxide layers 141 and 143 is monoclinic phase. That is, the crystallized metal oxide layers 141 and 143 may include monoclinic phase, tetragonal phase, cubic phase, and orthorhombic phase, while the monoclinic phase has a highest percentage among all crystalline phase. In some embodiments, the percentage of the monoclinic phase of each of the metal oxide layers 141 and 143 is in a range from about 40% to about 100%. For example, in some embodiments, the percentage of the monoclinic phase of each of the metal oxide layers 141 and 143 is about 40%, while other 60% of each of the metal oxide layers 141 and 143 may include a combination of tetragonal phase, cubic phase, and orthorhombic phase.

Figure 21:
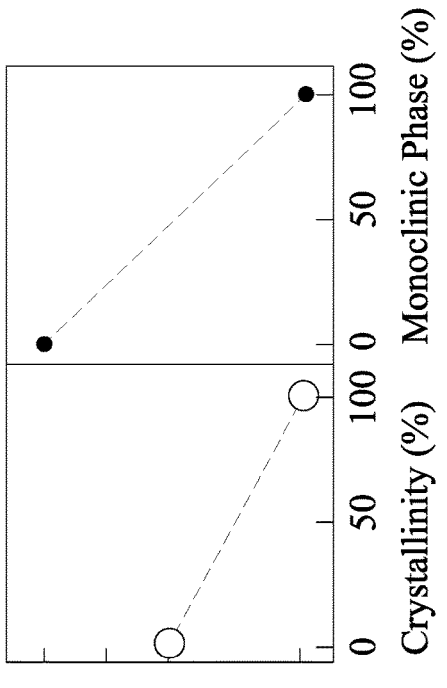
FIG. 21 shows experiment results in accordance with some embodiments of the present disclosure.

FIG. 21 shows experiment results in accordance with some embodiments of the present disclosure. It can be seen that, on the left side of FIG. 21, when the crystallinity of the metal oxide layer 141 (or 143) increases from 0% (e.g., amorphous) to 100%, the effective k-value will decrease accordingly. Furthermore, on the right side of FIG. 21, when the percentage of the monoclinic phase of the metal oxide layer 141 (or 143) increases from 0% to 100%, the effective k-value will decrease accordingly. The results show that the increased crystallinity and the increased percentage of the monoclinic phase are beneficial for lowering the effective k-value of the hard masks 140.

Referring back to FIGS. 12A to 12C, in some embodiments, the annealing process AN can be a rapid thermal annealing (RTA) process. The annealing process AN may be performed under a temperature in a range from about 700° C. to about 1300° C. In some embodiments, the annealing process AN may be performed under a temperature greater than about 900° C., such as about 900° C. to about 1300° C. The duration of the annealing process AN may be in a range from about 0.1 ms to about 300 s. In some embodiments, the duration of the annealing process AN may be lower than about 30 s, such as about 0.1 ms to about 30 s. In some embodiments, the annealing process AN may be performed in about 0.05% to about 100% oxygen ($O_2$) gas environment under a pressure in a range from about 5 torr to about 100 torr. If the annealing process AN is performed under a condition beyond the above mentioned ranges, the dominated phase of the crystallized metal oxide layers 141 and 143 may not be monoclinic phase, which will resulting in an unsatisfying device performance.

Figure 13B:
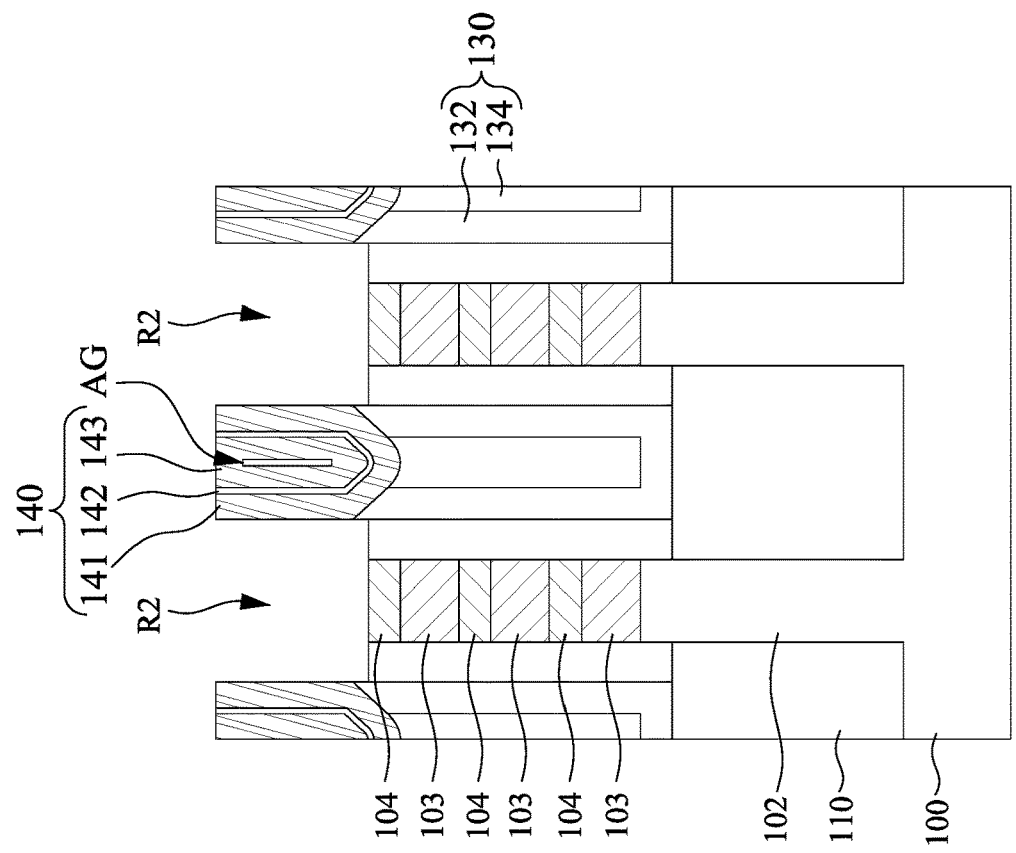
Figure 13A:
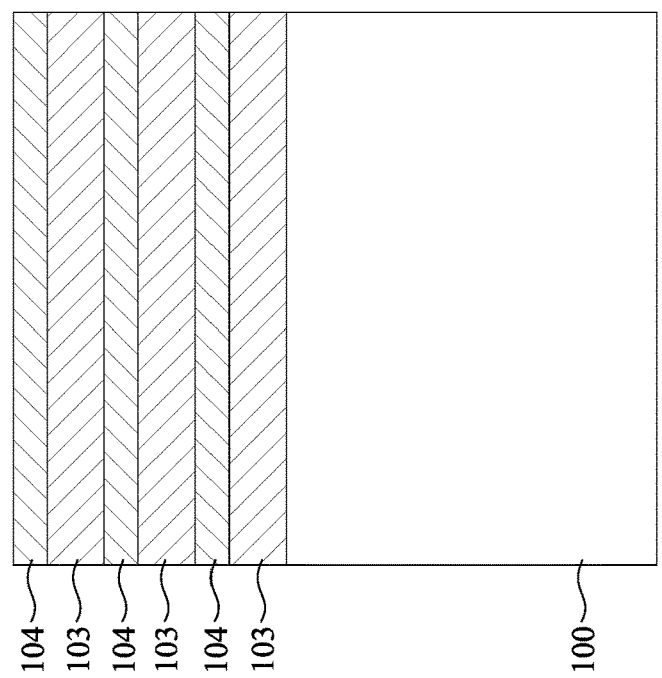
Figure 13C:
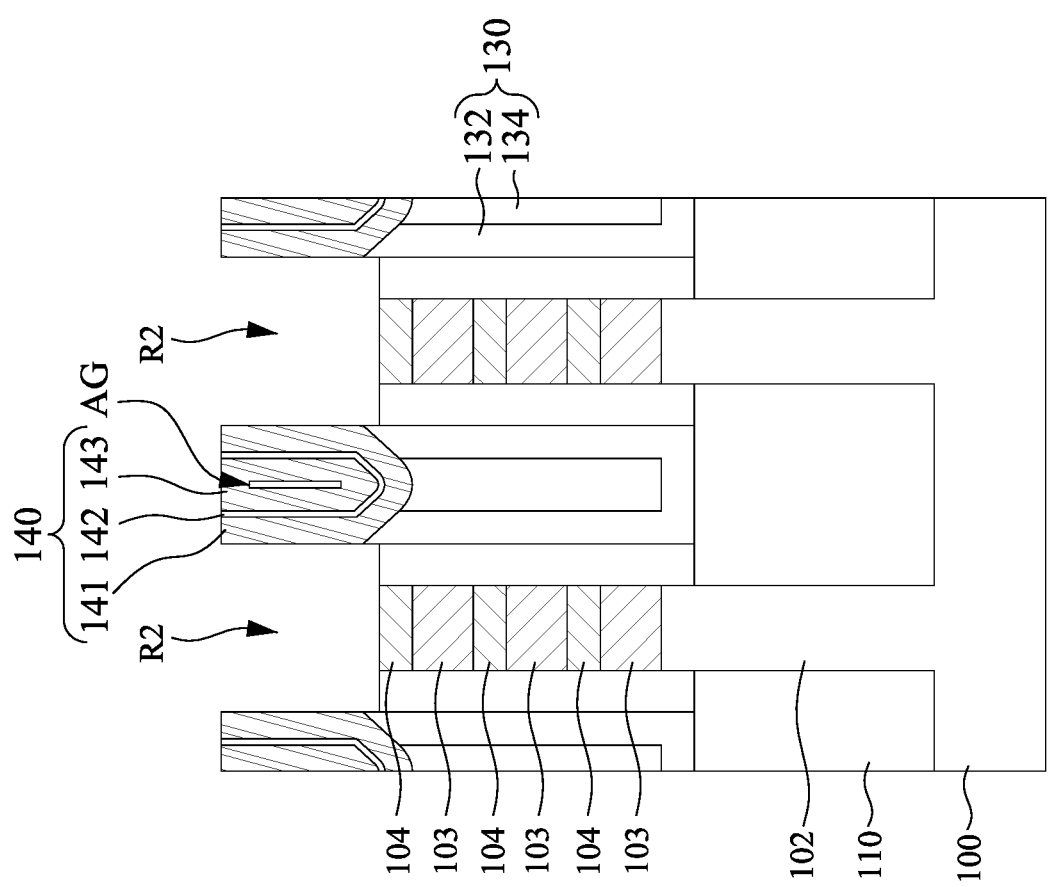

Reference is made to FIGS. 13A to 13C. An etching back process is performed to the semiconductor layers 103, 104, and 125, so as to lower top surfaces of the semiconductor layers 103, 104, and 125 to positions lower than the top surfaces of the hard masks 140. After the etching back process is completed, recesses R2 are formed over the semiconductor layers 103, 104, and 125, and between two adjacent hard masks 140. In some embodiments, the recesses R2 expose at least portions of the isolation film 132 of the isolation structure 130.

Figure 14B:
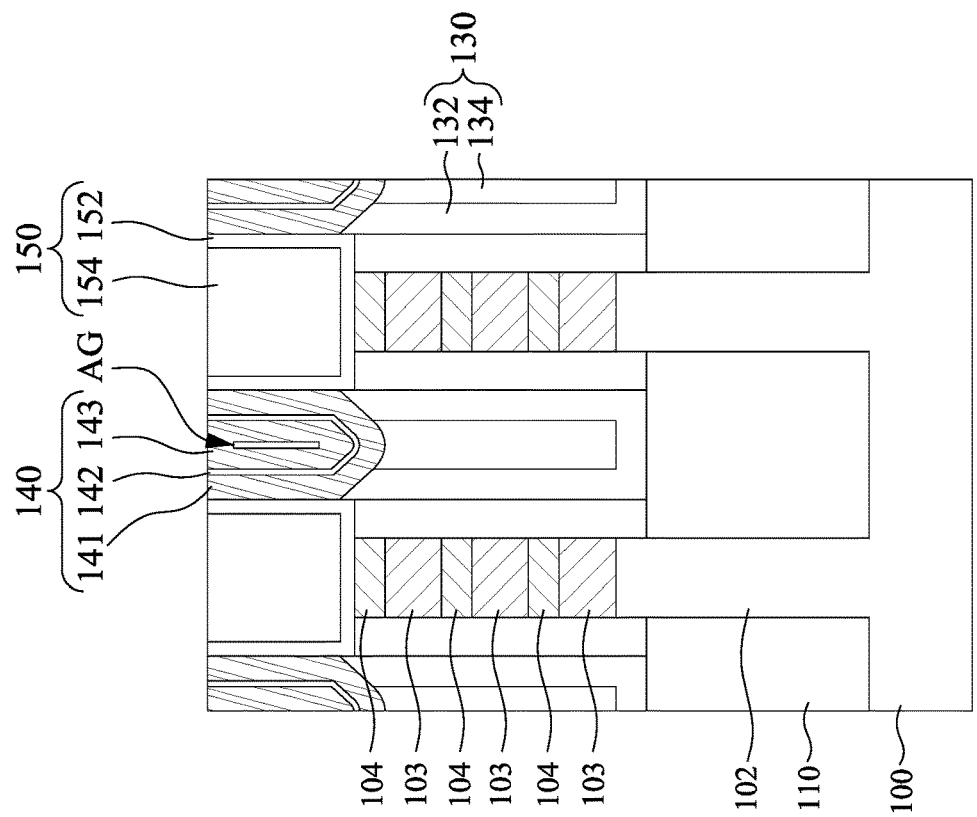
Figure 14A:
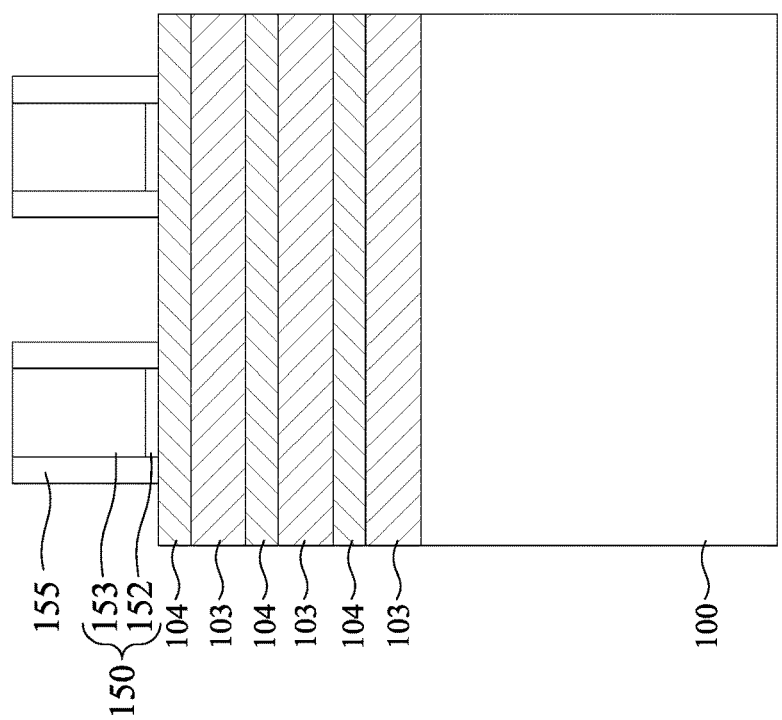
Figure 14C:
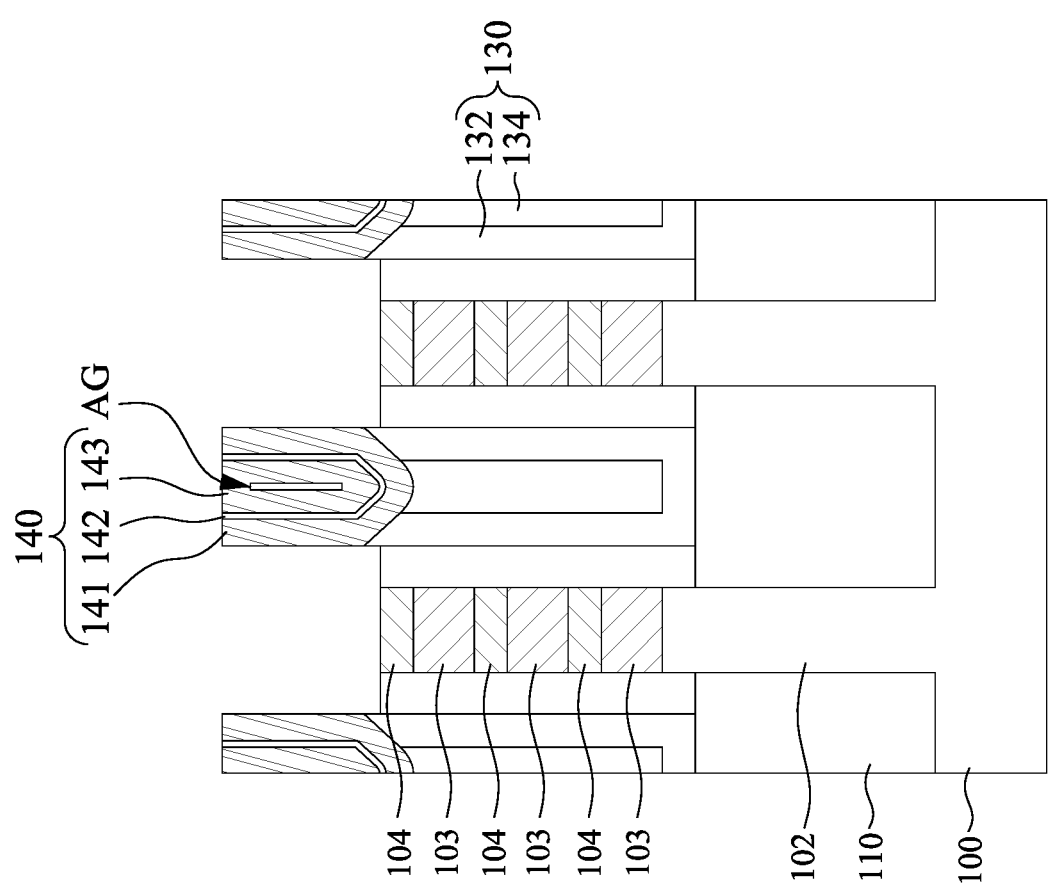

Reference is made to FIGS. 14A to 14C. Dummy gate structures 150 are formed over the semiconductor layers 103, 104, and gate spacers 155 are formed on opposite sidewalls of the dummy gate structure 330. In some embodiments, the dummy gate structure 150 may be formed by, for example, depositing a gate dielectric layer 152 and a gate electrode 154 over the semiconductor layers 103, 104, performing a CMP process until the top surface of the dielectric layer 176 is exposed, and subsequently performing a patterning process. The remaining portions of the gate dielectric layer 152 and the gate electrode 154 can be collectively referred to as dummy gate structures 150. In some embodiments, the gate spacers 155 may be formed by, for example, depositing a spacer material blanket over the dummy gate structures 150, and subsequently performing an etching process to remove horizontal portions of the spacer material, such that vertical portions of the spacer material remains on sidewalls of the dummy gate structures 150. In the cross-sectional view of FIG. 14B, each of the dummy gate structures 150 is formed between adjacent hard masks.

In some embodiments, the gate. dielectric layer 152 may be, for example, silicon oxide, silicon nitride, a combination thereof, or the like, and may be deposited or thermally grown according to acceptable techniques. The gate dielectric layer 152 may be formed by a suitable process, such as chemical vapor deposition (CVD), physical vapor deposition (PVD), atomic layer deposition (ALD), or any suitable process. The gate electrode 154 may include polycrystalline-silicon (poly-Si) or poly-crystalline silicon-germanium (poly-SiGe). Further, the gate electrode 154 may be doped poly-silicon with uniform or non-uniform doping. The gate electrode 154 may be formed by a suitable process, such as chemical vapor deposition (CVD), physical vapor deposition (PVD), atomic layer deposition (ALD), or any suitable process.

Figure 15B:
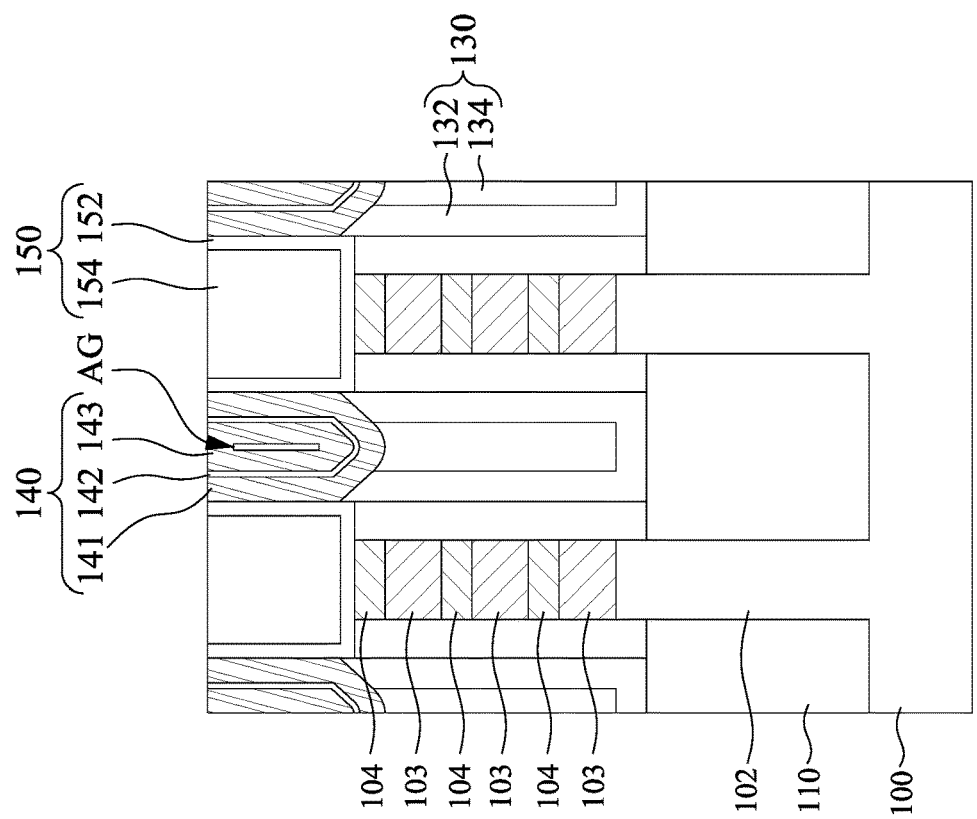
Figure 15A:
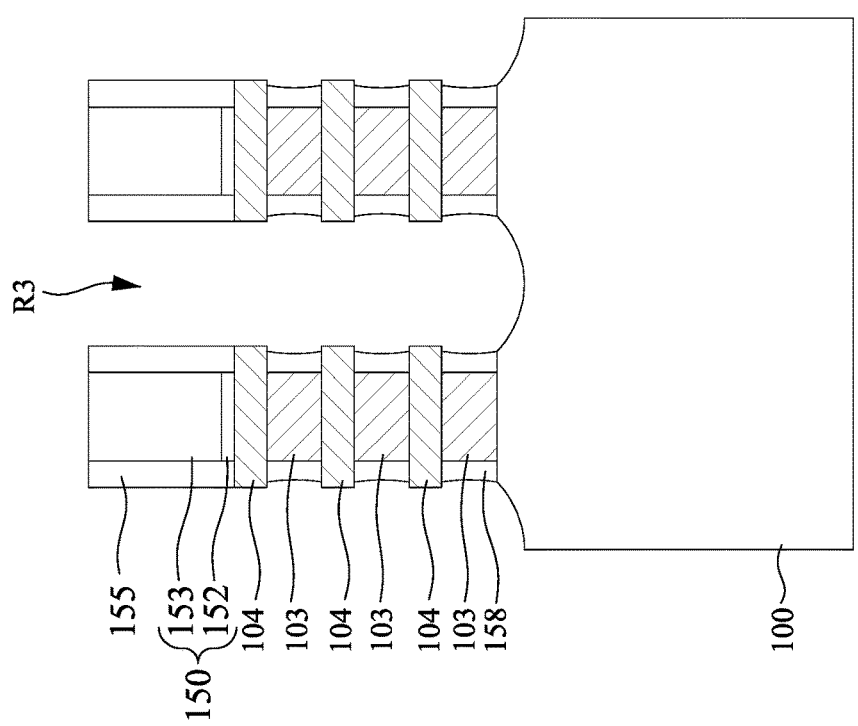
Figure 15C:
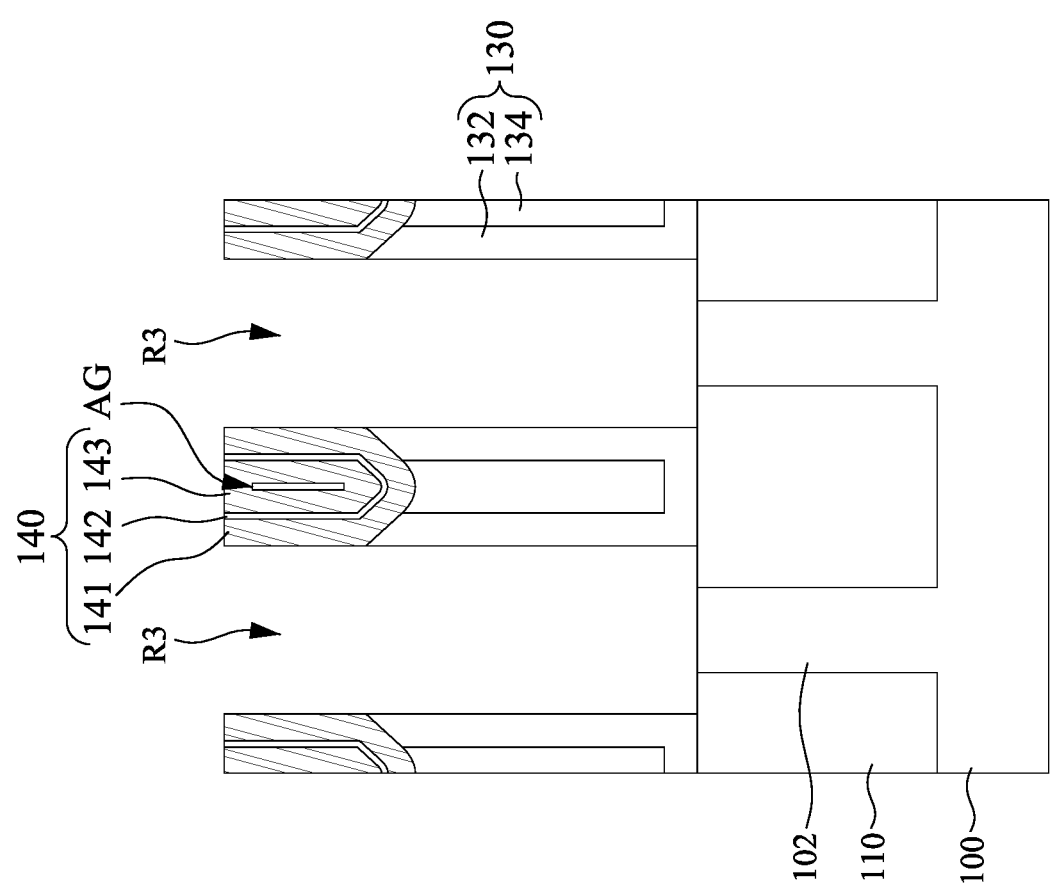

Reference is made to FIGS. 15A to 15C. The semiconductor layers 103, 104 are recessed to form recesses R3, so as to expose the top surfaces of the semiconductor strips 102. In greater details, the semiconductor layers 103, 104 are recessed by using the hard masks 140, the dummy gate structures 150, and the gate spacers 155 as etch masks. Afterward, the semiconductor layers 103 are etched, and a plurality of inner spacers 158 are formed vertically between the semiconductor layers 104. In some embodiments, a first etching process is performed to remove portions of the semiconductor layers 103, 104 not covered by the dummy gate structures 150 to form the recesses R3. Then, a second etch process is performed to laterally shorten the semiconductor layers 103 through the recesses R3, so as to form spaces between two adjacent semiconductor layers 104. Next, inner spacers 158 are formed in the spaces between two adjacent semiconductor layers 104 by a suitable deposition process. For example, the inner spacers 158 may be formed by depositing a spacer material blanket over the substrate 100 and subsequently performing a patterning process to remove portions of the spacer material, such that the remaining portions of the spacer material are left in the spaces between two adjacent semiconductor layers 104.

Figure 16C:
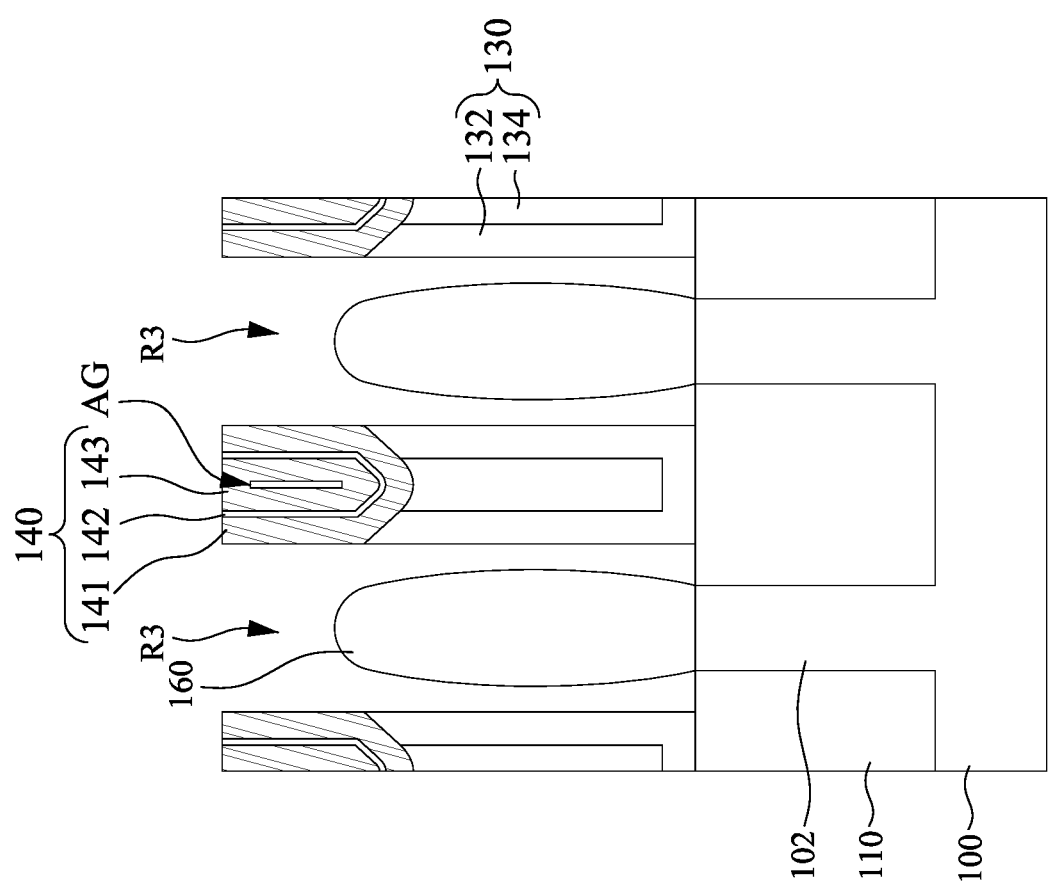

Reference is made to FIGS. 16A to 16C. Epitaxy source/drain structures 160 are formed over the semiconductor strips 102 and on opposite sides of the dummy gate structures 150. In some embodiments, the epitaxy source/drain structures may be formed by selective epitaxial growth (SEG). In various embodiments, the epitaxy structures 160 may include Ge, Si, GaAs, AlGaAs, SiGe, GaAsP, SiP, or other suitable material. In some embodiments, the epitaxy structures 160 may be doped with p-type dopants or n-type dopants.

Figure 17B:
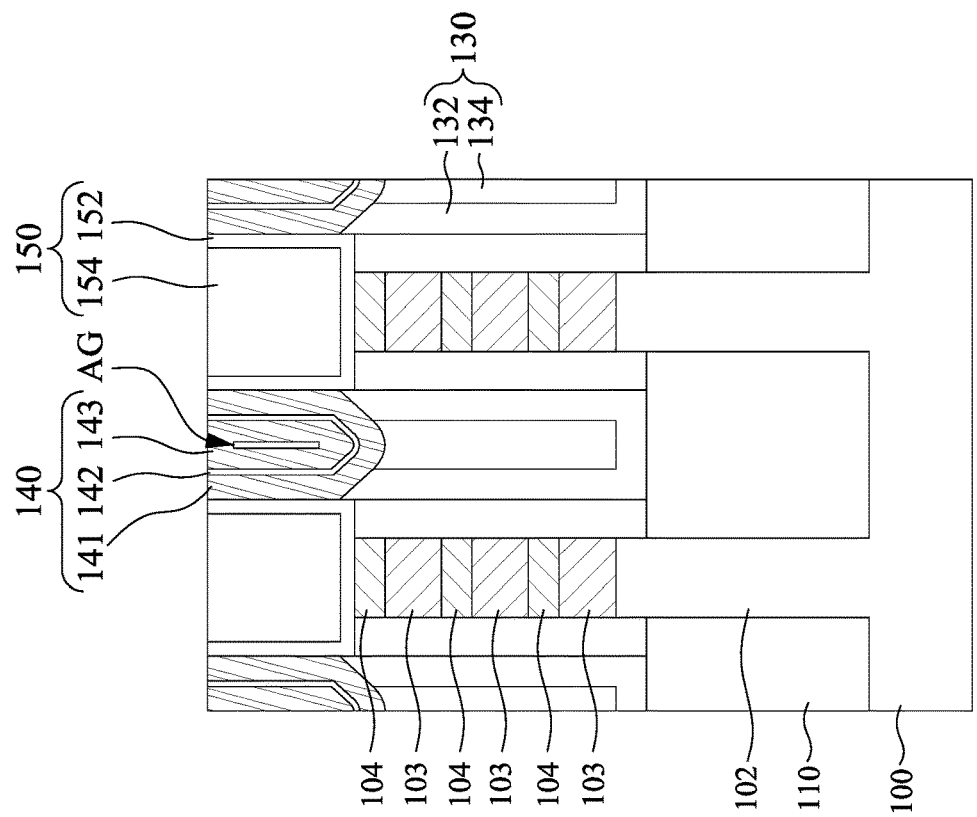
Figure 17A:
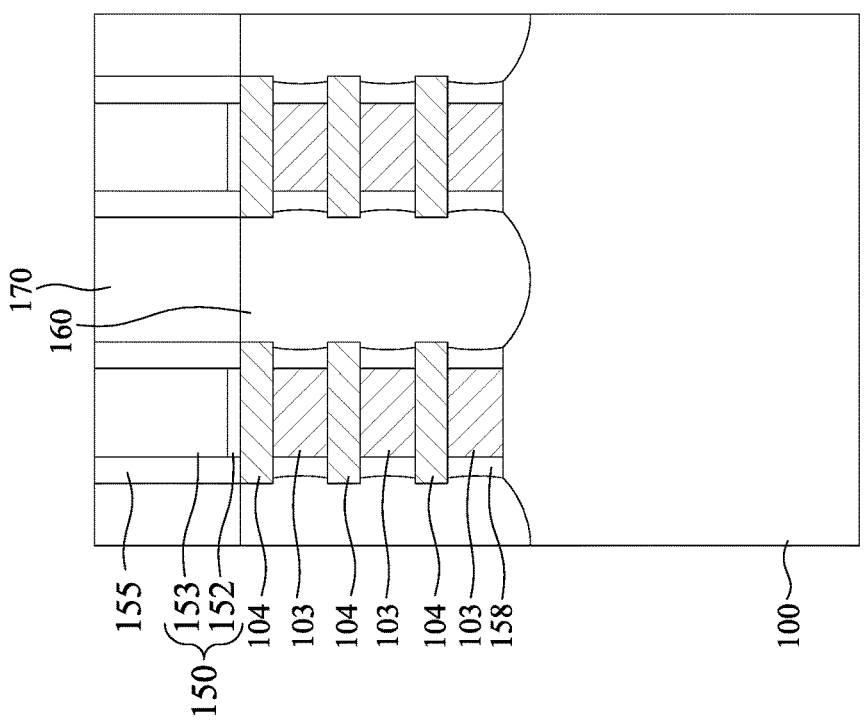
Figure 17C:
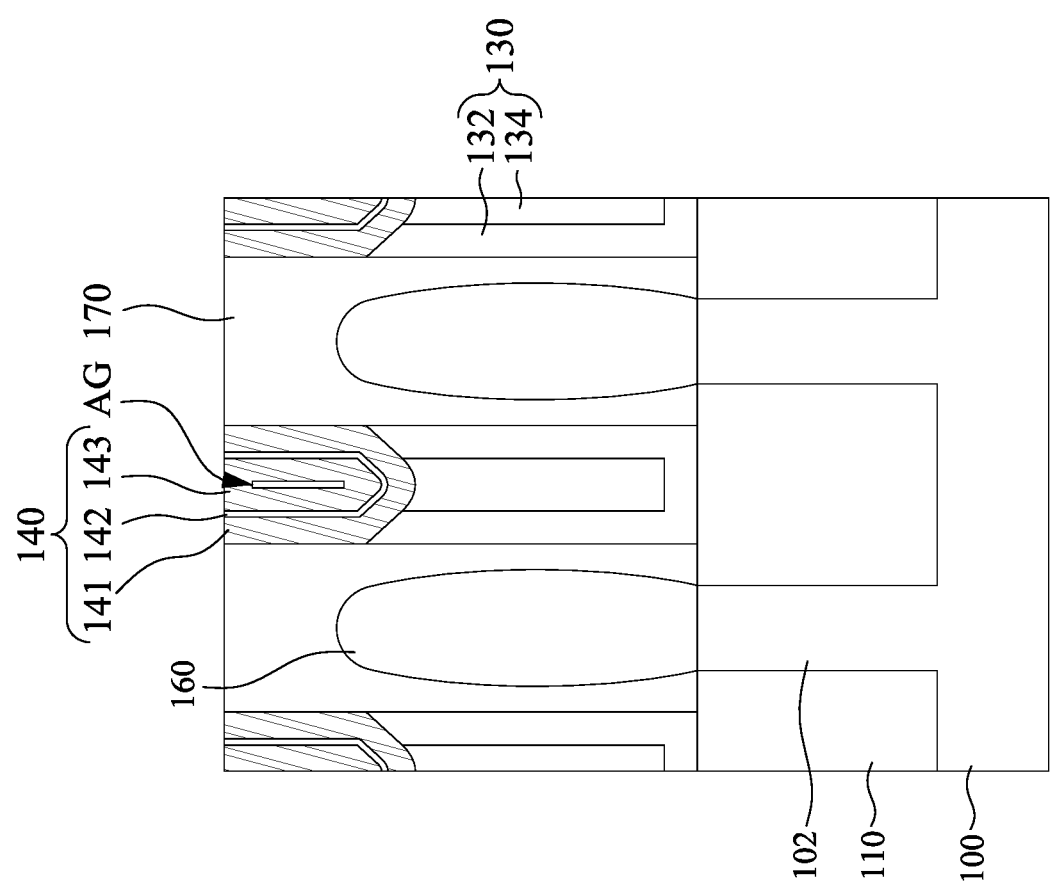

Reference is made to FIGS. 17A to 17C. An interlayer dielectric (ILD) layer 170 is formed over the epitaxy structures 160 and laterally surrounding the dummy gate structures 150. In some embodiments, the ILD layer 170 may be formed by, for example, depositing an ILD material layer over the substrate 100 and subsequently performing a CMP process to remove the excess ILD material layer until the top surfaces of the dummy gate structures 150 are exposed. In some embodiments, the ILD layer 170 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

Figure 18B:
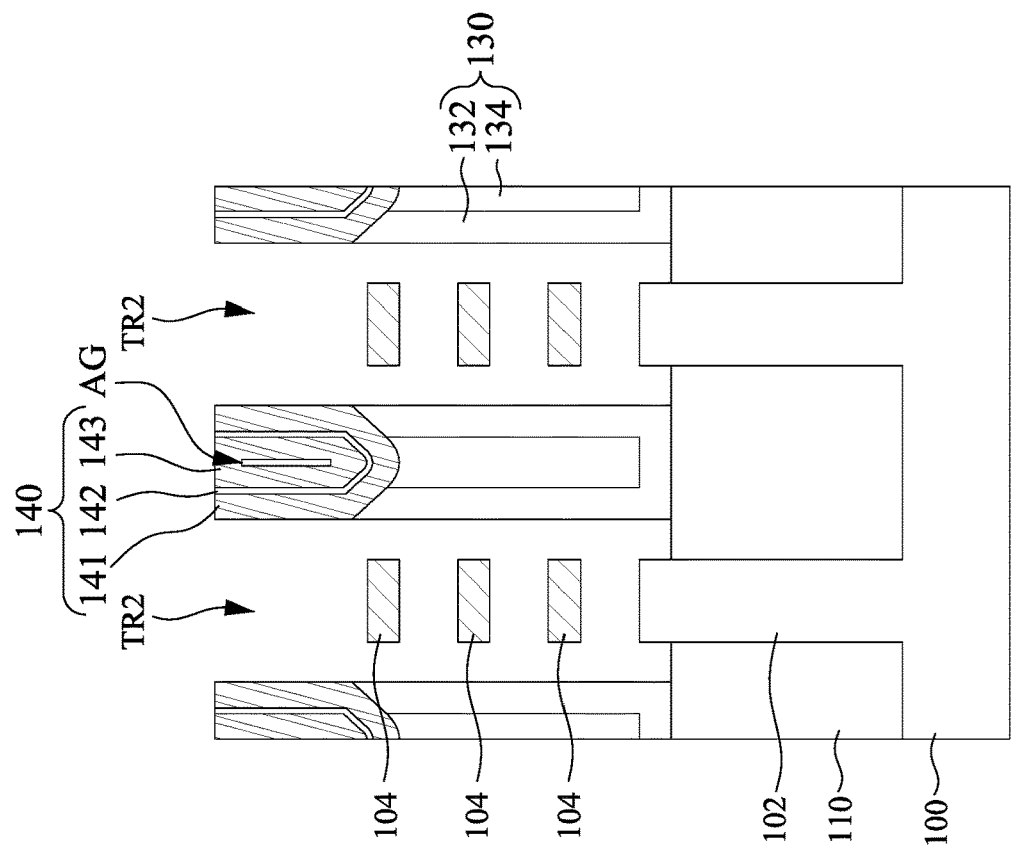
Figure 18A:
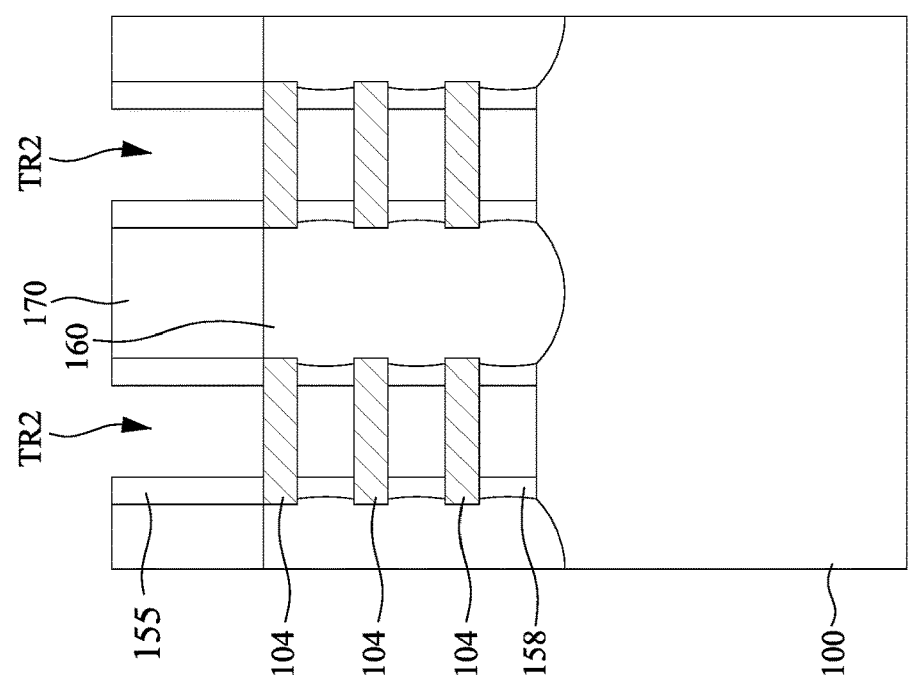
Figure 18C:
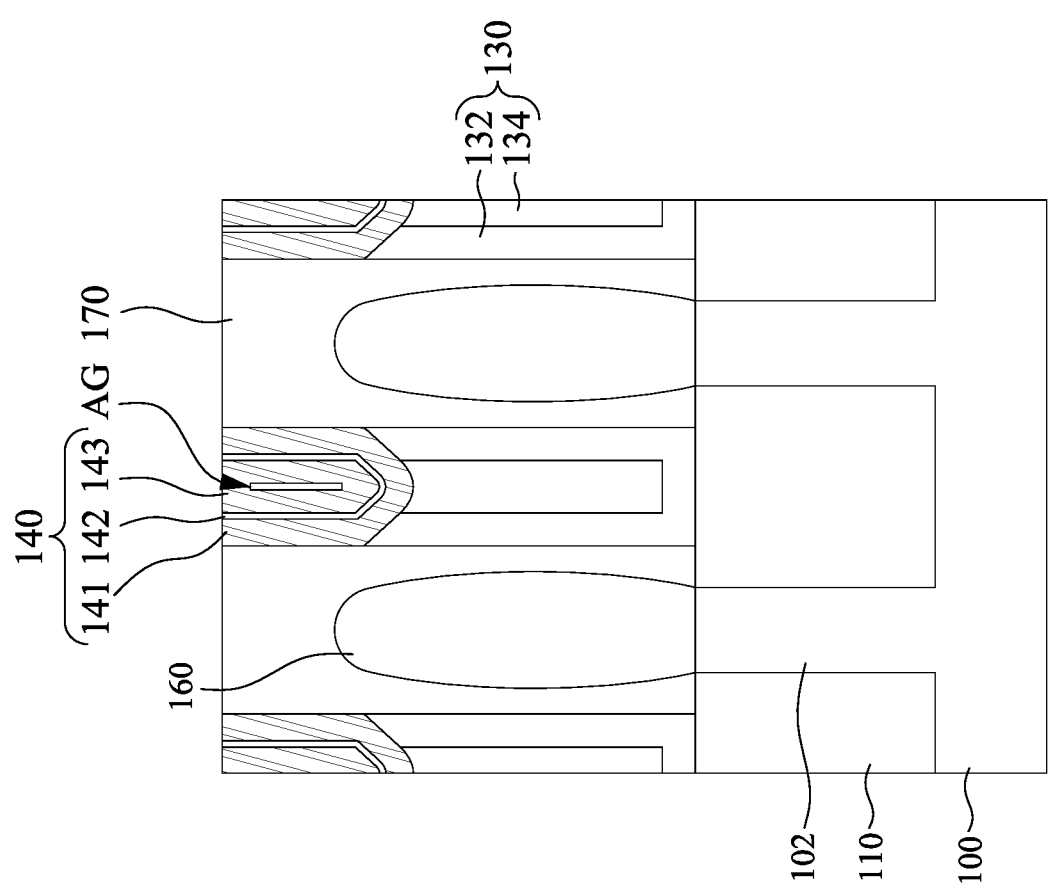

Reference is made to FIGS. 18A to 18C. The dummy gate structures 150, the semiconductor layers 103, and the semiconductor layer 125 are removed to form gate trenches TR2. In FIG. 18A, each gate trench TR2 is between adjacent gate spacers 155. In FIG. 18B, each gate trench TR2 at least exposes sidewalls of the isolation structure 130 and sidewalls of the hard masks 140. In some embodiments, the dummy gate structures 150, the semiconductor layers 103, and the semiconductor layer 125 may be removed by a suitable process, such as wet etch, dry etch, or combinations thereof.

Figure 19B:
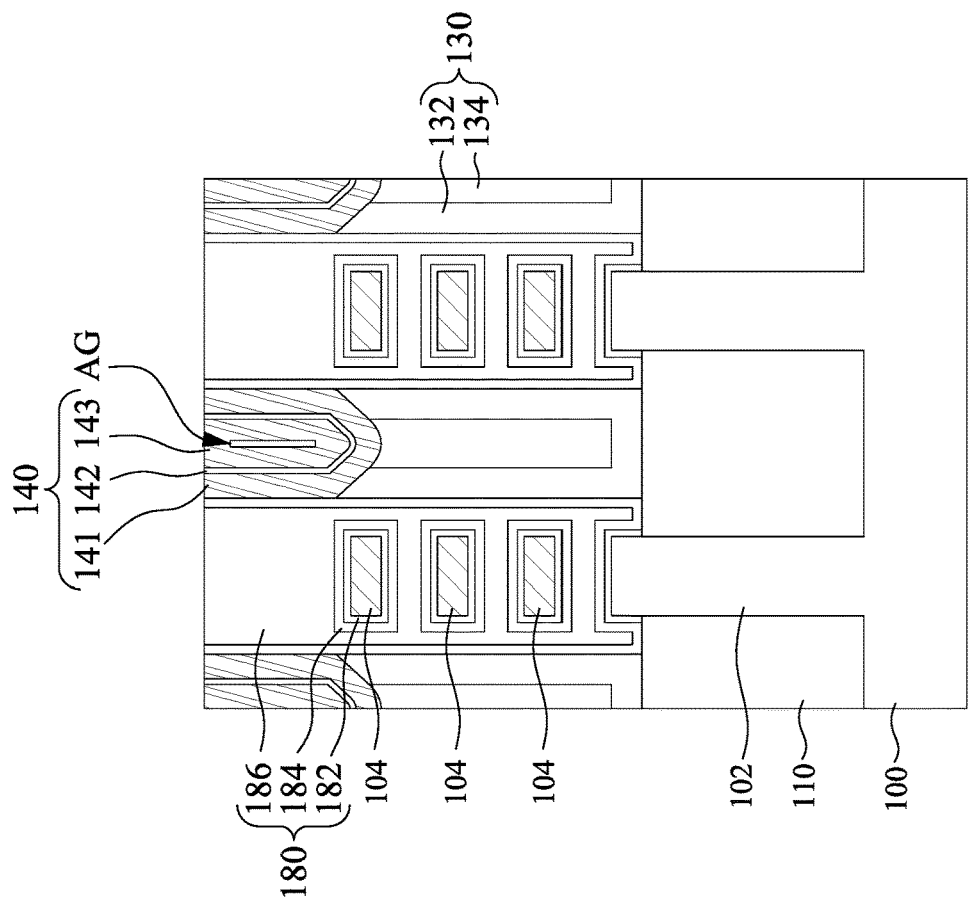
Figure 19A:
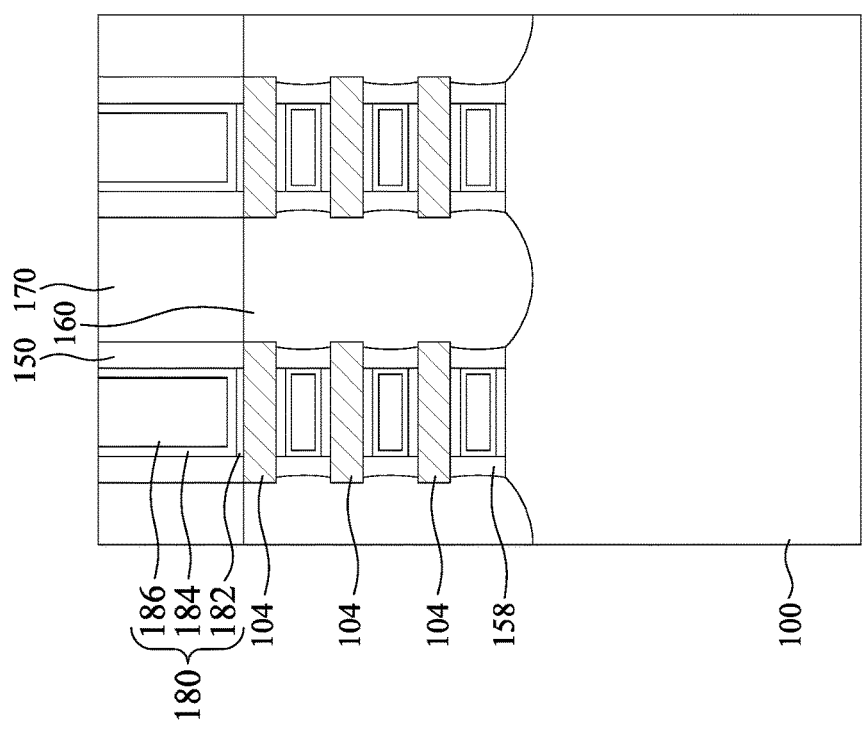
Figure 19C:
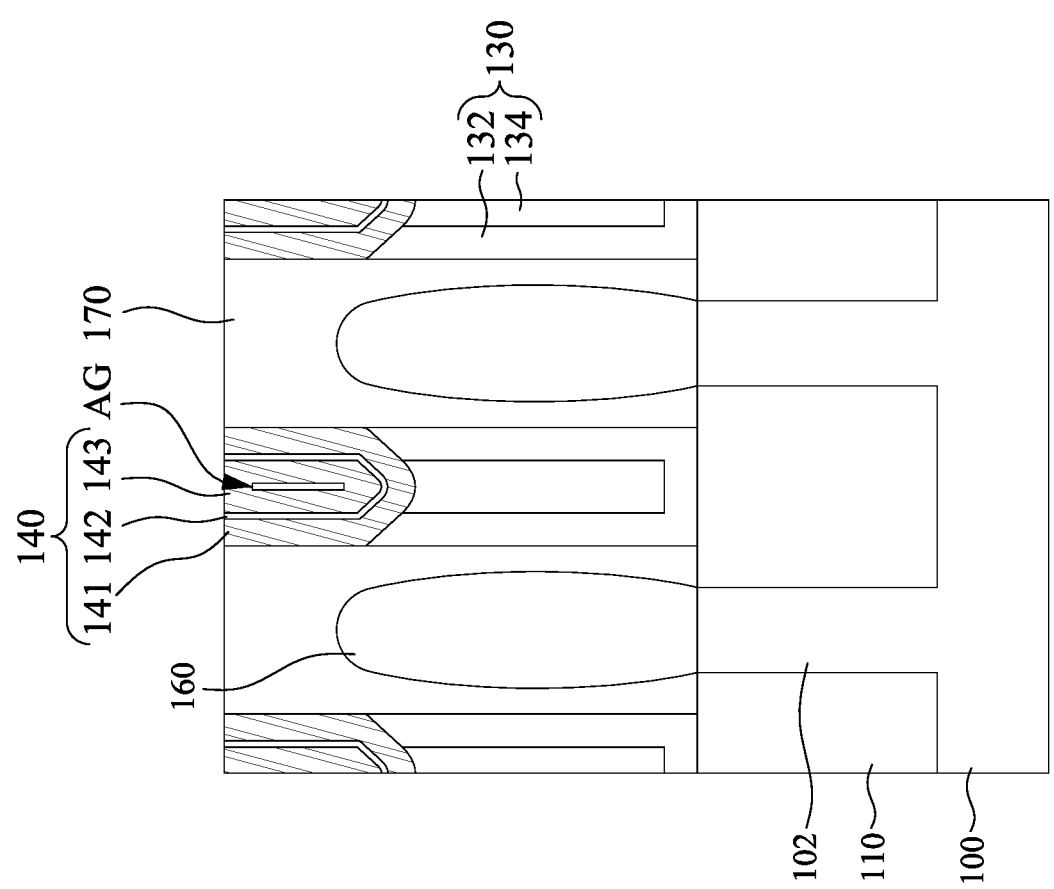

Reference is made to FIGS. 19A to 19C. Metal gate structures 180 are formed in the gate trenches TR2. In some embodiments, the gate structures 180 include an interfacial layer 182, a gate dielectric layer 184 over the interfacial layer 182, and a gate conductive layer 186 over the gate dielectric layer 184. In some embodiments, the gate structures 180 may be formed by, for example, forming an interfacial material selectively on the exposed semiconductor layers 104, depositing a gate dielectric material over the interfacial material, depositing a gate conductive material over the gate dielectric material, and subsequently performing a CMP process until the top surface of the ILD layer 170 is exposed.

As shown in FIG. 19B, the gate dielectric layers 184 of the gate structures 180 extend along the sidewalls of the isolation structures 130 and the sidewalls of the hard masks 140. In greater details, the gate dielectric layers 184 of the gate structures 180 are in contact with the isolation film 132 of the isolation structures 130, and are in contact with the metal oxide layer 141 of the hard masks 140.

In some embodiments, the interfacial layer 182 may be made of oxide, such as silicon oxide ($SiO_2$). In some embodiments, the interfacial layer 182 may be formed by an oxidation process, such as a thermal oxidation process.

In some embodiments, the gate dielectric layers 184 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 184 may include oxide layers. The gate dielectric layer 184 may be formed by PVD, CVD, ALD, or other suitable deposition processes.

In some embodiments, the gate conductive layer 186 may include a work function metal layer and a filling metal. The work function metal layer may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The filling metal may include tungsten (W), aluminum (Al), copper (Cu), or another suitable conductive material(s). The gate conductive layer 186 may be formed by PVD, CVD, ALD, or other suitable deposition processes.

Figure 19D:
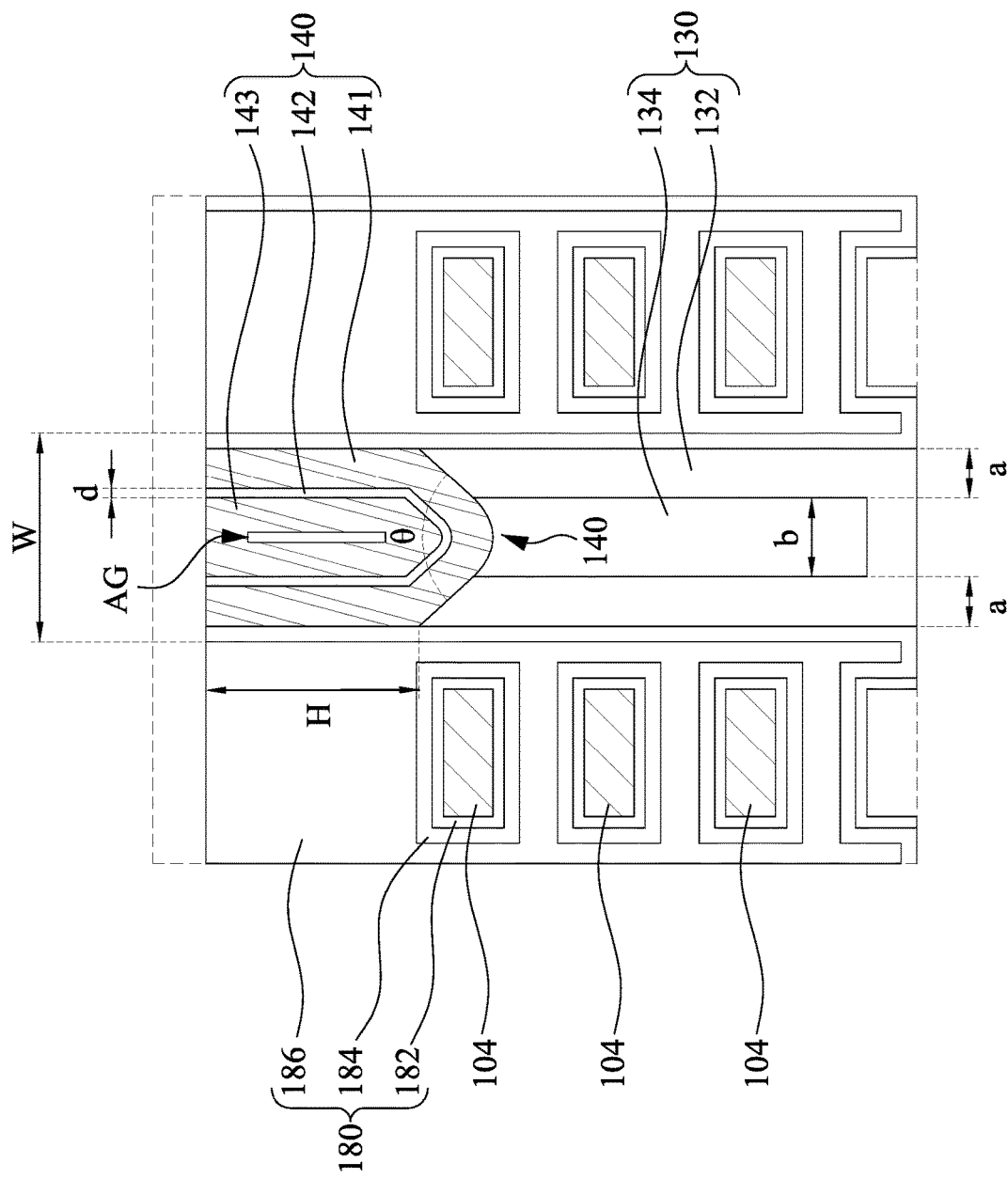

Reference is made to FIG. 19D, in which FIG. 19D is an enlarged view of FIG. 19B. After the metal gate structures 180 are formed, the resulting structure may include at least two gate structures 180, and may include an isolation structure 130 and a hard mask 140 that laterally separates the metal gate structures 180.

In greater details, the isolation structure 130 includes an isolation film 132 and an isolation film 134 over the isolation film 132, in which the isolation film 132 has two vertical portions lining opposite sidewalls of the isolation film 134. The vertical portions of the isolation film 132 has a lateral thickness a, and the isolation film 134 has a lateral thickness b. In some embodiments, the thickness a is greater than the thickness b. In other embodiments, the thickness a is lower than the thickness b. In yet other embodiments, the thickness a is substantially equal the thickness b.

The hard mask 140 includes a metal oxide layer 141, an oxide layer 142 over the metal oxide layer 141, and metal oxide layer 143 over the oxide layer 142. The hard mask 140 has a height H and a width W. In some embodiments, the height H of the hard mask 140 is in a range from about 10 nm to about 30 nm. In some embodiments, the width W of the hard mask 140 is in a range from about 10 nm to about 2000 nm. In one embodiments, the height H of the hard mask 140 is about 25 nm, and the width W of the hard mask 140 is about 18 nm. Here, the "height" of the hard mask 140 is the vertical length of the sidewall of the hard mask 140 that is in contact with the gate structure 180.

In some embodiments, the metal oxide layers 141 and 143 are thicker than the oxide layer 142. The oxide layer 142 has a thickness d. In some embodiments, the thickness d of the oxide layer 142 is in a range from about 0 nm to about 1.5 nm. The metal oxide layer 143 includes an air gap AG. In some embodiments, in the cross-sectional view of FIG. 19D, the ratio of the area of the air gap AG to the area of the hard mask HM is in a range from about 0% to about 10%. In one embodiment, the thickness d of the oxide layer 142 is about 0.5 nm, and the area ratio of the air gap AG is about 2%. In some embodiments, the oxide layer 142 may be omitted. In some embodiments, the air gap AG may not be formed in the metal oxide layer 143.

In some embodiments, the hard mask 140 has a bottom tip 140T. In some embodiments, the bottom tip 140T has a rounded surface. In some embodiments, the bottom tip 140T of the hard mask 140 is formed by two inclined surfaces, in which the two inclined surfaces form an angle θ there between. In some embodiments, the angle θ is in a range from about 60° to about 179°. In some other embodiments, the angle θ of the bottom tip of the recess R1 may be in a range from about 85° to about 95°, such as 90°. In some embodiments, a bottommost end of the metal oxide layer 141 of the hard mask 140 is lower than topmost ends of the isolation films 132 and 134 of the isolation structure 130.

Figure 22:
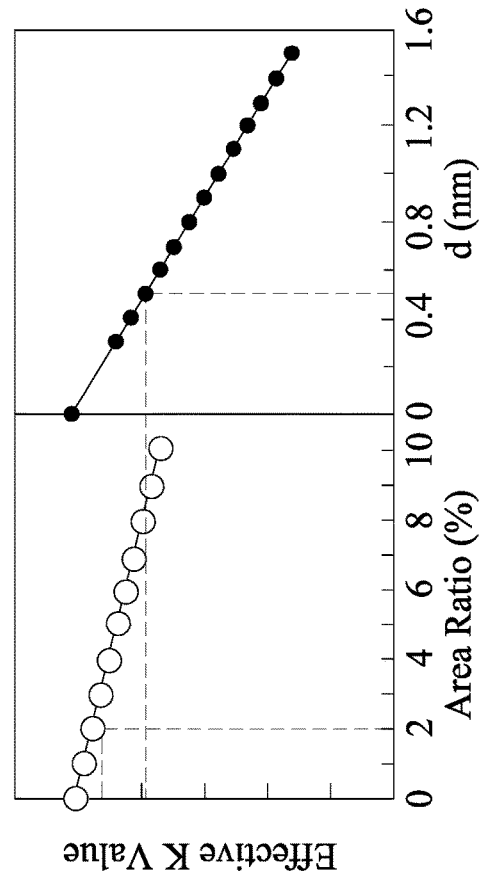
FIG. 22 shows experiment results in accordance with some embodiments of the present disclosure.

FIG. 22 shows experiment results in accordance with some embodiments of the present disclosure. It can be seen that, on the left side of FIG. 22, when the area ratio of the air gap AG increases, the effective k-value will decrease accordingly. Furthermore, on the right side of FIG. 22, when the thickness d of the oxide layer 142 increases, the effective k-value will decrease accordingly. The results show that the formations of oxide layer 142 and the air gap AG are beneficial for lowering the effective k-value of the hard mask 140.

Figure 23B:
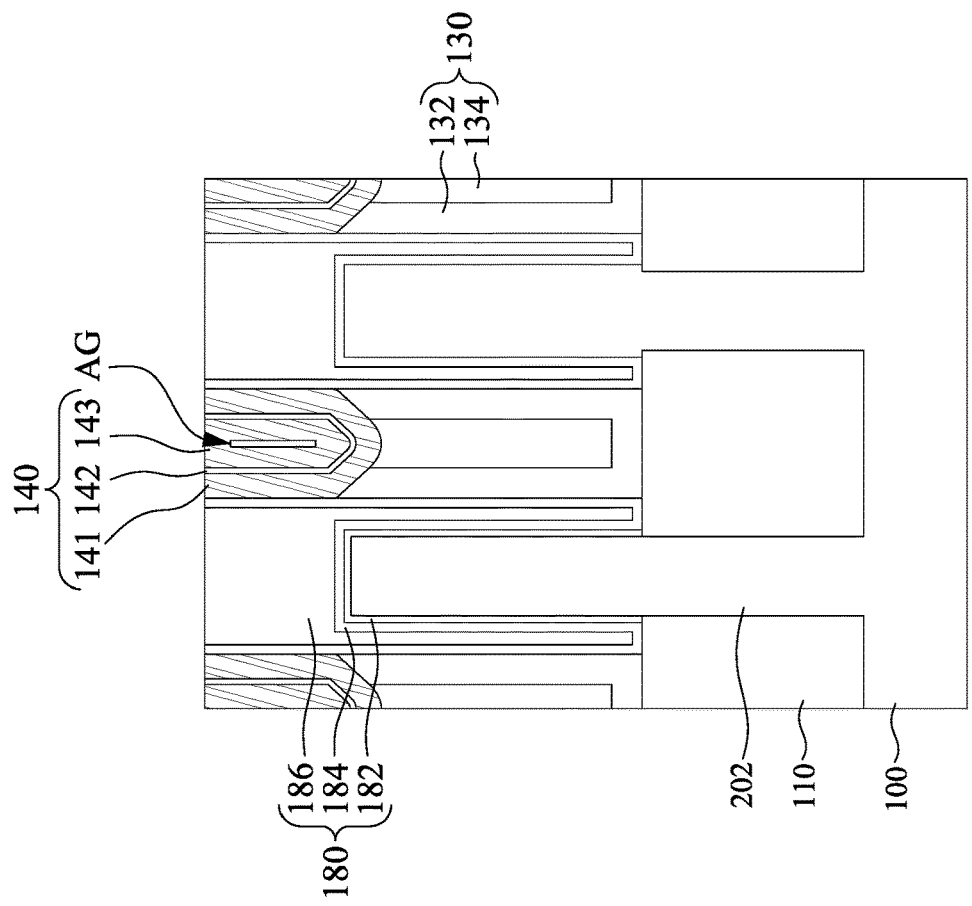
FIGS. 23A, 23B, and 23C are cross-sectional views of intermediate stages in the manufacturing of a semiconductor device in accordance with some embodiments.
Figure 23A:
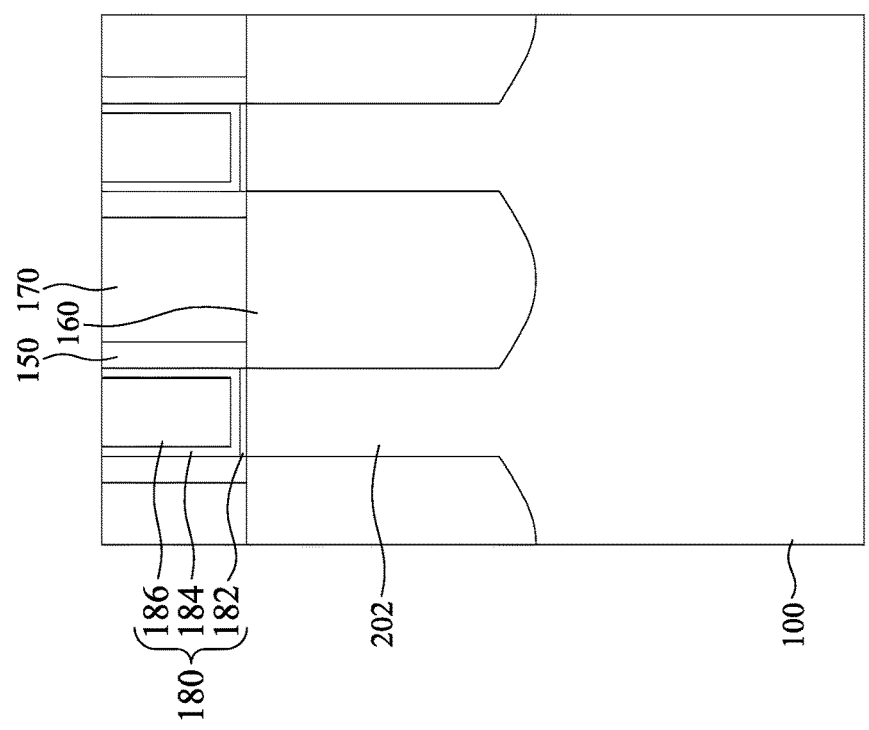
Figure 23C:
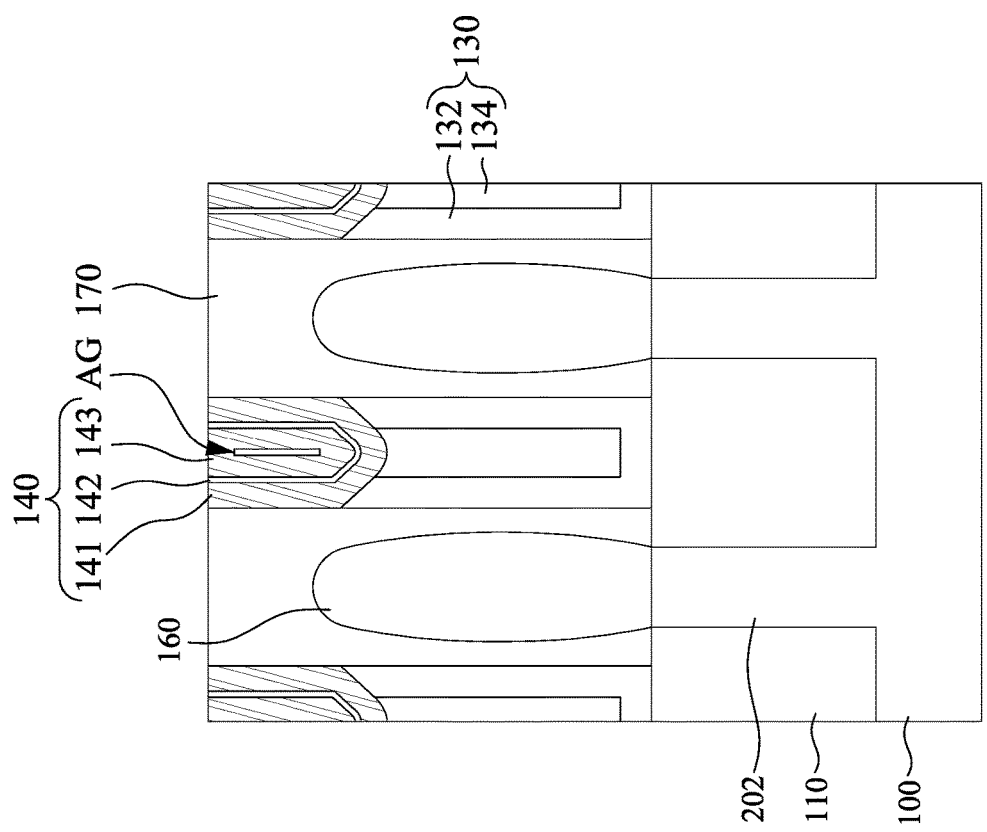

FIGS. 23A, 23B, and 23C are cross-sectional views of intermediate stages in the manufacturing of a semiconductor device in accordance with some embodiments. The cross-sectional views of FIGS. 23A, 23B, and 23C are the same as the cross-sectional views of FIGS. 19A, 19B, and 19C. Furthermore, some elements of FIGS. 23A, 23B, and 23C are the same as those described in FIGS. 19A, 19B, and 19C, such elements are labeled the same, and relevant details will not be repeated for brevity.

FIGS. 23A, 23B, and 23C are different from FIGS. 19A, 19B, and 19C, in that the semiconductor device shown in FIGS. 23A, 23B, and 23C is a fin-type filed effect transistor. For example, semiconductor fins 202 are disposed over the substrate 100. The gate structures 180 may cross the corresponding semiconductor fins 202. In some embodiments, the semiconductor fins 202 may be made of silicon, germanium, or silicon-germanium alloy ($Si_xGe_{1-x}$, $0 \le x \le 1$). In some embodiments, the semiconductor fins 202 can be formed by patterning the substrate 100. Other structures shown in FIGS. 23A, 23B, and 23C may be formed by using similar methods as described in FIGS. 2A to 19C, and thus relevant details will not be repeated.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage of the embodiments is that by forming an amorphous metal oxide hard mask, followed by an annealing process to change the amorphous metal oxide hard mask into crystalized metal oxide hard mask, which can improve the etching resistance for following etching process. Another advantage of the embodiments is that by controlling the conditions of the annealing process, the major phase of the crystalized metal oxide hard mask will be monoclinic phase, which can lower the effective k-value of the hard mask. Yet advantage of the embodiments is that by forming an oxide layer and air gap in the metal oxide hard mask, which can further lower the effective k-value of the hard mask.

In some embodiments of the present disclosure, a method includes forming a semiconductor fin protruding over a substrate; forming an isolation structure over the substrate; depositing a first metal oxide layer over the isolation structure; depositing a first oxide layer over the first metal oxide layer; depositing a second metal oxide layer over the first oxide layer, in which the first metal oxide layer and the second metal oxide layer comprise amorphous structures; performing a chemical mechanism polishing (CMP) process to the first metal oxide layer, the first oxide layer, and the second metal oxide layer; after the CMP process is completed, performing an annealing process such that the first metal oxide layer and the second metal oxide layer are transferred from the amorphous structures into crystalline structures; forming a gate structure over the semiconductor fin; and forming source/drain structures over the substrate and on opposite sides of the gate structure.

In some embodiments, the method further includes depositing a second oxide layer over the second metal oxide layer; and depositing a third metal oxide layer over the second oxide layer, in which the CMP process remove an entirety of the second oxide layer and the third metal oxide layer from the substrate.

In some embodiments, forming the isolation structure includes depositing a first isolation film over the substrate; and depositing a second isolation film over the first isolation film, in which the second isolation film is made of a different material than the first isolation film.

In some embodiments, the method further includes performing an etching back process to the isolation structure prior to depositing the first metal oxide layer, in which the first isolation film has a higher etching resistance to the etching back process than that of the second isolation film, such that a top surface of the second isolation film is lower than a top surface of the first isolation film after the etching back process is completed.

In some embodiments, an air gap is formed in the second metal oxide layer during depositing the second metal oxide layer.

In some embodiments, the first oxide layer has a lower dielectric constant than those of the first metal oxide layer and the second metal oxide layer.

In some embodiments, the method further includes etching back the isolation structure such that the isolation structure has a concave top surface.

In some embodiments, the method further includes forming a shallow trench isolation (STI) structure over the substrate prior to forming the isolation structure, in which isolation structure is in contact with a top surface of the STI structure.

In some embodiments, the method further includes forming a semiconductor layer along a sidewall of the semiconductor fin prior to depositing the first metal oxide layer, in which the first metal oxide layer is in contact with the semiconductor layer.

In some embodiments, the annealing process is performed under a temperature in a range from about 700° C. to about 1300° C., the annealing process is performed for a duration in a range from 0.1 ms to about 300 s, and the annealing process is performed under a pressure in a range from about 5 torr to about 1000 torr.

In some embodiments of the present disclosure, a method includes forming first and second semiconductor layers alternately arranged over a substrate; depositing a third semiconductor layer along sidewalls of the first and second semiconductor layers; depositing a first isolation film over the substrate and along a sidewall of the third semiconductor layer; depositing a second isolation film over the first isolation film; performing an etching back process to the first and second isolation films, in which the first isolation film has a higher etching resistance to the etching back process than that of the second isolation film, such that a top surface of the first isolation film is higher than a top surface of the second isolation film after the etching back process is completed; depositing a first metal oxide layer over the first and second isolation films; depositing a first oxide layer over the first metal oxide layer; depositing a second metal oxide layer over the first oxide layer, in which an air gap is formed in the second metal oxide layer; removing the first semiconductor layers; forming a gate structure wrapping the second semiconductor layers; and forming source/drain structures over the substrate and on opposite sides of the gate structure.

In some embodiments, the method further includes performing a chemical mechanism polishing (CMP) process to the first metal oxide layer, the first oxide layer, and the second metal oxide layer; and after the CMP process is completed, performing an annealing process such that the first metal oxide layer and the second metal oxide layer are transferred from amorphous structures into crystalline structures.

In some embodiments, the method further includes depositing a second oxide layer over the second metal oxide layer; and depositing a third metal oxide layer over the second oxide layer.

In some embodiments, removing the first semiconductor layers further removes the third semiconductor layer.

In some embodiments, the first oxide layer is thinner than the first metal oxide layer and the second metal oxide layer.

In some embodiments of the present disclosure, a semiconductor device includes a substrate, nanostructures, a gate structure, source/drain structures, an isolation structure, and a capping layer. The nanostructures are alternately arranged over the substrate. The gate structure is over the substrate and wraps each of the nanostructures. The source/drain structures are over the substrate and on opposite sides of the gate structure. The isolation structure is over the substrate and along a sidewall of the gate structure. The capping layer is over the isolation structure and along the sidewall of the gate structure, in which the capping layer includes a first metal oxide layer, an oxide layer, and a second metal oxide layer, in which crystalline phases of the first metal oxide layer include a monoclinic phase, and the monoclinic phase of the crystalline phases of the first metal oxide layer has a highest percentage among the crystalline phases of the first metal oxide layer.

In some embodiments, the crystalline phases of the first metal oxide layer further include a tetragonal phase, a cubic phase, and an orthorhombic phase.

In some embodiments, the second metal oxide layer includes an air gap.

In some embodiments, crystalline phases of the second metal oxide layer include a monoclinic phase, and the monoclinic phase of the crystalline phases of the second metal oxide layer has a highest percentage among the crystalline phases of the second metal oxide layer.

In some embodiments, first metal oxide layer and the second metal oxide layer are made of a same material that has a higher dielectric constant than that of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor fin protruding over a substrate;
    forming an isolation structure over the substrate;
    depositing a first metal oxide layer over the isolation structure;
    depositing a first oxide layer over the first metal oxide layer;
    depositing a second metal oxide layer over the first oxide layer, wherein the first metal oxide layer and the second metal oxide layer comprise amorphous structures;
    performing a chemical mechanism polishing (CMP) process to the first metal oxide layer, the first oxide layer, and the second metal oxide layer;
    after the CMP process is completed, performing an annealing process such that the first metal oxide layer and the second metal oxide layer are transferred from the amorphous structures into crystalline structures;
    forming a gate structure over the semiconductor fin; and
    forming source/drain structures over the substrate and on opposite sides of the gate structure.

2. The method of claim 1, further comprising:
    depositing a second oxide layer over the second metal oxide layer; and
    depositing a third metal oxide layer over the second oxide layer, wherein the CMP process remove an entirety of the second oxide layer and the third metal oxide layer from the substrate.

3. The method of claim 1, wherein forming the isolation structure comprises:
    depositing a first isolation film over the substrate; and
    depositing a second isolation film over the first isolation film, wherein the second isolation film is made of a different material than the first isolation film.

4. The method of claim 3, further comprising performing an etching back process to the isolation structure prior to depositing the first metal oxide layer, wherein the first isolation film has a higher etching resistance to the etching back process than that of the second isolation film, such that a top surface of the second isolation film is lower than a top surface of the first isolation film after the etching back process is completed.

5. The method of claim 1, wherein an air gap is formed in the second metal oxide layer during depositing the second metal oxide layer.

6. The method of claim 1, wherein the first oxide layer has a lower dielectric constant than those of the first metal oxide layer and the second metal oxide layer.

7. The method of claim 1, further comprising etching back the isolation structure such that the isolation structure has a concave top surface.

8. The method of claim 1, further comprising forming a shallow trench isolation (STI) structure over the substrate prior to forming the isolation structure, wherein isolation structure is in contact with a top surface of the STI structure.

9. The method of claim 1, further comprising forming a semiconductor layer along a sidewall of the semiconductor fin prior to depositing the first metal oxide layer, wherein the first metal oxide layer is in contact with the semiconductor layer.

10. The method of claim 1, wherein the annealing process is performed under a temperature in a range from about 700° C. to about 1300° C., the annealing process is performed for a duration in a range from 0.1 ms to about 300s, and the annealing process is performed under a pressure in a range from about 5 torr to about 1000 torr.

11. A method, comprising:
forming first and second semiconductor layers alternately arranged over a substrate;
depositing a third semiconductor layer along sidewalls of the first and second semiconductor layers;
depositing a first isolation film over the substrate and along a sidewall of the third semiconductor layer;
depositing a second isolation film over the first isolation film;
performing an etching back process to the first and second isolation films, wherein the first isolation film has a higher etching resistance to the etching back process than that of the second isolation film, such that a top surface of the first isolation film is higher than a top surface of the second isolation film after the etching back process is completed;
depositing a first metal oxide layer over the first and second isolation films;
depositing a first oxide layer over the first metal oxide layer;
depositing a second metal oxide layer over the first oxide layer, wherein an air gap is formed in the second metal oxide layer;
removing the first semiconductor layers;
forming a gate structure wrapping the second semiconductor layers; and
forming source/drain structures over the substrate and on opposite sides of the gate structure.

12. The method of claim 11, further comprising:
performing a chemical mechanism polishing (CMP) process to the first metal oxide layer, the first oxide layer, and the second metal oxide layer; and
after the CMP process is completed, performing an annealing process such that the first metal oxide layer and the second metal oxide layer are transferred from amorphous structures into crystalline structures.

13. The method of claim 11, further comprising:
depositing a second oxide layer over the second metal oxide layer; and
depositing a third metal oxide layer over the second oxide layer.

14. The method of claim 11, wherein removing the first semiconductor layers further removes the third semiconductor layer.

15. The method of claim 11, wherein the first oxide layer is thinner than the first metal oxide layer and the second metal oxide layer.

16. A method, comprising:
forming a semiconductor layer over a substrate;
forming source/drain structures over the substrate and on opposite sides of the semiconductor layer;
forming an isolation structure over the substrate; and
forming a capping layer over the isolation structure, wherein the capping layer comprises:
a first metal oxide layer, wherein crystalline phases of the first metal oxide layer comprise a monoclinic phase, and the monoclinic phase of the crystalline phases of the first metal oxide layer has a highest percentage among the crystalline phases of the first metal oxide layer;
an oxide layer; and
a second metal oxide layer; and
forming a gate structure wrapping around the semiconductor layer and along the isolation structure and the capping layer.

17. The method of claim 16, wherein the crystalline phases of the first metal oxide layer further comprise a tetragonal phase, a cubic phase, and an orthorhombic phase.

18. The method of claim 16, wherein the second metal oxide layer comprises an air gap.

19. The method of claim 16, wherein the first metal oxide layer and the second metal oxide layer are made of a same material that has a higher dielectric constant than that of the oxide layer.

20. The method of claim 16, further comprising performing a chemical mechanism polishing (CMP) process to the first metal oxide layer, the oxide layer, and the second metal oxide layer prior to forming the gate structure.

* * * * *